US009815688B2

(12) United States Patent
Graves et al.

(10) Patent No.: US 9,815,688 B2
(45) Date of Patent: Nov. 14, 2017

(54) DEVICE AND METHOD FOR MICRO-ELECTRO-MECHANICAL-SYSTEM PHOTONIC SWITCH

(71) Applicant: Huawei Technologies Co., Ltd., Shenzhen (CN)

(72) Inventors: Alan Frank Graves, Kanata (CA); Dominic John Goodwill, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 368 days.

(21) Appl. No.: 14/495,475

(22) Filed: Sep. 24, 2014

(65) Prior Publication Data

US 2016/0085066 A1    Mar. 24, 2016

(51) Int. Cl.
| | |
|---|---|
| *B81B 7/02* | (2006.01) |
| *B81B 7/00* | (2006.01) |
| *G02B 26/08* | (2006.01) |
| *G02B 6/30* | (2006.01) |
| *G02B 6/35* | (2006.01) |

(Continued)

(52) U.S. Cl.
CPC ........... *B81B 7/008* (2013.01); *B81B 7/02* (2013.01); *G02B 6/30* (2013.01); *G02B 6/3556* (2013.01); *G02B 26/0841* (2013.01); *G02B 6/2935* (2013.01); *G02B 6/32* (2013.01); *G02B 6/3512* (2013.01)

(58) Field of Classification Search
CPC .... G02B 6/3518; G02B 6/359; G02B 6/3556; G02B 6/3568; G02B 2006/12104
See application file for complete search history.

(56) References Cited

U.S. PATENT DOCUMENTS 6,591,029 B1    7/2003 Lin et al.
6,643,425 B1 *  11/2003 Bowers ................. G02B 6/359
                                                359/223.1

(Continued)

FOREIGN PATENT DOCUMENTS

CN    1497283 A    5/2004

OTHER PUBLICATIONS

PCT International Search Report and Written Opinion, PCT/CN2015/088789, Applicant: Huawei Technologies Co., Ltd., dated Nov. 23, 2015, 11 pages.

(Continued)

*Primary Examiner* — Luke D Ratcliffe
(74) *Attorney, Agent, or Firm* — Slater Matsil, LLP

(57) ABSTRACT

In one embodiment, a method of aligning mirrors of a micro-electro-mechanical system (MEMS) photonic switch includes illuminating a first group of photodiodes associated with a first mirror of a first mirror array of the MEMS photonic switch by a first control beam during a first period of time and illuminating a second group of photodiodes associated with a second mirror of the first mirror array by a second control beam during a second period of time, where the second control beam is off during the first period of time, where the first control beam is off during the second period of time, and where the second period of time is after the first period of time. The method also includes illuminating the first group of photodiodes by the first control beam during a third period of time, where the second control beam is off during the third period of time, and where the third period of time is after the second period of time.

18 Claims, 29 Drawing Sheets

(51) Int. Cl.
G02B 6/32 (2006.01)
G02B 6/293 (2006.01)

(56) References Cited

U.S. PATENT DOCUMENTS

| | | |
|---|---|---|
| 6,760,505 B1 | 7/2004 | Street et al. |
| 2003/0086147 A1* | 5/2003 | Bruns ............... G02B 6/3518 359/291 |
| 2005/0117838 A1 | 6/2005 | Okada et al. |
| 2015/0041629 A1 | 2/2015 | Graves et al. |
| 2015/0138623 A1 | 5/2015 | Graves et al. |
| 2015/0139585 A1 | 5/2015 | Graves et al. |

OTHER PUBLICATIONS

Aksyuk, V.A., et al., "238 × 238 Micromechanical Optical Cross Connect," IEEE Photonics Technology Letters, vol. 15, No. 4, Apr. 2003, pp. 587-589.
Calient Technologies, Inc., "S320 Photonic Switch," Calient Data Sheet—2012, 2 pages.
Chu, P.B., et al., "Design and Nonlinear Servo Control of MEMS Mirrors and Their Performance in a Large Port-count Optical Switch," Journal of Microelectromechanical Systems, vol. 14, No. 2, Apr. 2005, pp. 261-273.
Kawajiri, Y., et al., "512 × 512 Port 3D MEMS Optical Switch Module with Toroidal Concave Mirror," NTT Technical Review, vol. 10 No. 11, Nov. 2012, pp. 1-7.
Kim, J., et al., "1100 × 1100 Port MEMS-Based Optical Crossconnect With 4-dB Maximum Loss," IEEE Photonics Technology Letters, vol. 15, No. 11, Nov. 2003, pp. 1537-1539.
Wu, M.C., "Optical MEMS for Telecommunication Systems," Lecture for EE 233, University of California, Berkeley Department of EECS & Berkeley Sensor and Actuator Center (BSAC), pp. 1-41.

\* cited by examiner

680

| | PD1 RESPONSE = 0 | PD2 RESPONSE = 0 | PD3 RESPONSE = 4 | PD4 RESPONSE = 2 | |
|---|---|---|---|---|---|
| PD5 RESPONSE = 0 | PD6 RESPONSE = 0 | PD7 RESPONSE = 0 | PD8 RESPONSE = 7 | PD9 RESPONSE = 6 | PD10 RESPONSE = 0 |
| PD11 RESPONSE = 0 | PD12 RESPONSE = 0 | PD13 RESPONSE = 0 | PD14 RESPONSE = 0 | PD15 RESPONSE = 0 | PD16 RESPONSE = 0 |
| PD17 RESPONSE = 0 | PD18 RESPONSE = 0 | PD19 RESPONSE = 0 | PD20 RESPONSE = 0 | PD21 RESPONSE = 0 | PD22 RESPONSE = 0 |
| PD23 RESPONSE = 0 | PD24 RESPONSE = 0 | PD25 RESPONSE = 0 | PD26 RESPONSE = 0 | PD27 RESPONSE = 0 | PD28 RESPONSE = 0 |
| | PD29 RESPONSE = 0 | PD30 RESPONSE = 0 | PD31 RESPONSE = 0 | PD32 RESPONSE = 0 | |

MAP OF DETECTED PHOTODIODE RESPONSES AT RECEIVER POWER ANALYZER

FIG. 20

DEVICE AND METHOD FOR MICRO-ELECTRO-MECHANICAL-SYSTEM PHOTONIC SWITCH

TECHNICAL FIELD

The present invention relates to photonics, and, in particular, to a device and method for a micro-electro-mechanical-system (MEMS) photonic switch.

BACKGROUND

A type of photonic switch is a three dimensional (3D) micro-electro-mechanical-system (MEMS) photonic switch. MEMS photonic switches have excellent properties, such as the ability to achieve a high port count. Also, MEMS photonic switches have excellent optical properties, such as low loss, low polarization dependence, high linearity, and low noise. Additionally, MEMS photonic switches have excellent off-state properties, such as high isolation and low crosstalk.

However, MEMS photonic switches have some issues that limit their widespread use, such as slow switching speeds, driven by complex methods of control. This is especially problematic when MEMS photonic switches are used in a cascade configuration, such as in a three stage CLOS switch, or to set up a path transiting multiple nodes across a photonic switched network. Also, control methods may leave residual modulation introduced by the switch, which can interfere with the cascading of the switch.

SUMMARY

An embodiment method of aligning mirrors of a micro-electro-mechanical system (MEMS) photonic switch includes illuminating a first group of photodiodes associated with a first mirror of a first mirror array of the MEMS photonic switch by a first control beam during a first period of time and illuminating a second group of photodiodes associated with a second mirror of the first mirror array by a second control beam during a second period of time, where the second control beam is off during the first period of time, where the first control beam is off during the second period of time, and where the second period of time is after the first period of time. The method also includes illuminating the first group of photodiodes by the first control beam during a third period of time, where the second control beam is off during the third period of time, and where the third period of time is after the second period of time.

An embodiment control system includes a first inject optical signal module configured to inject a first plurality of control optical beams into a first portion of collimators of a first collimator array of a micro-electro-mechanical system (MEMS) photonic switch to reflect off a first portion of mirrors of a first mirror array of the MEMS photonic switch to form a first plurality of beam spots on a second mirror array during a first timeslot and inject a second plurality of control optical beams into a second portion of collimators of the first collimator array to reflect off a second portion of mirrors of the first mirror array to form a second plurality of beam spots on the second mirror array during a second timeslot, where the second timeslot is after the first timeslot, where the second plurality of control optical beams are off during the first timeslot, and where the first plurality of control optical beams are off during the second timeslot. The control system also includes a mirror acquisition control unit coupled to the MEMS photonic switch, where the mirror acquisition control unit is configured to receive a first plurality of signals from a first plurality of photodiodes on the second mirror array to detect the first plurality of beam spots during the first timeslot and a second plurality of signals from a second plurality of photodiodes on the second mirror array to detect the second plurality of beam spots. Additionally, the control system includes a mirror driver coupled to the mirror acquisition control unit, where the mirror driver is configured to be coupled to the MEMS photonic switch, and where the mirror driver is configured to control the first portion of mirrors in accordance with the first plurality of signals during the first timeslot and to control the second portion of mirrors in accordance with the second plurality of signals during the second timeslot.

An embodiment control system includes a processor and a computer readable storage medium storing programming for execution by the processor. The programming includes instructions to produce a sequence of optical control beams in accordance with a framing structure and couple the sequence of optical control beams to an array of collimators of a micro-electro-mechanical system (MEMS) photonic switch to reflect off mirrors of a first mirror array of the MEMS photonic switch to produce beam spots on a second mirror array of the MEMS photonic switch and receive a plurality of signals from a plurality of photodiodes on the second mirror array and to control mirrors of the first mirror array in accordance with the plurality of signals.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 20 illustrates a photodiode response for a MEMS mirror array with interstitial photodiodes;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
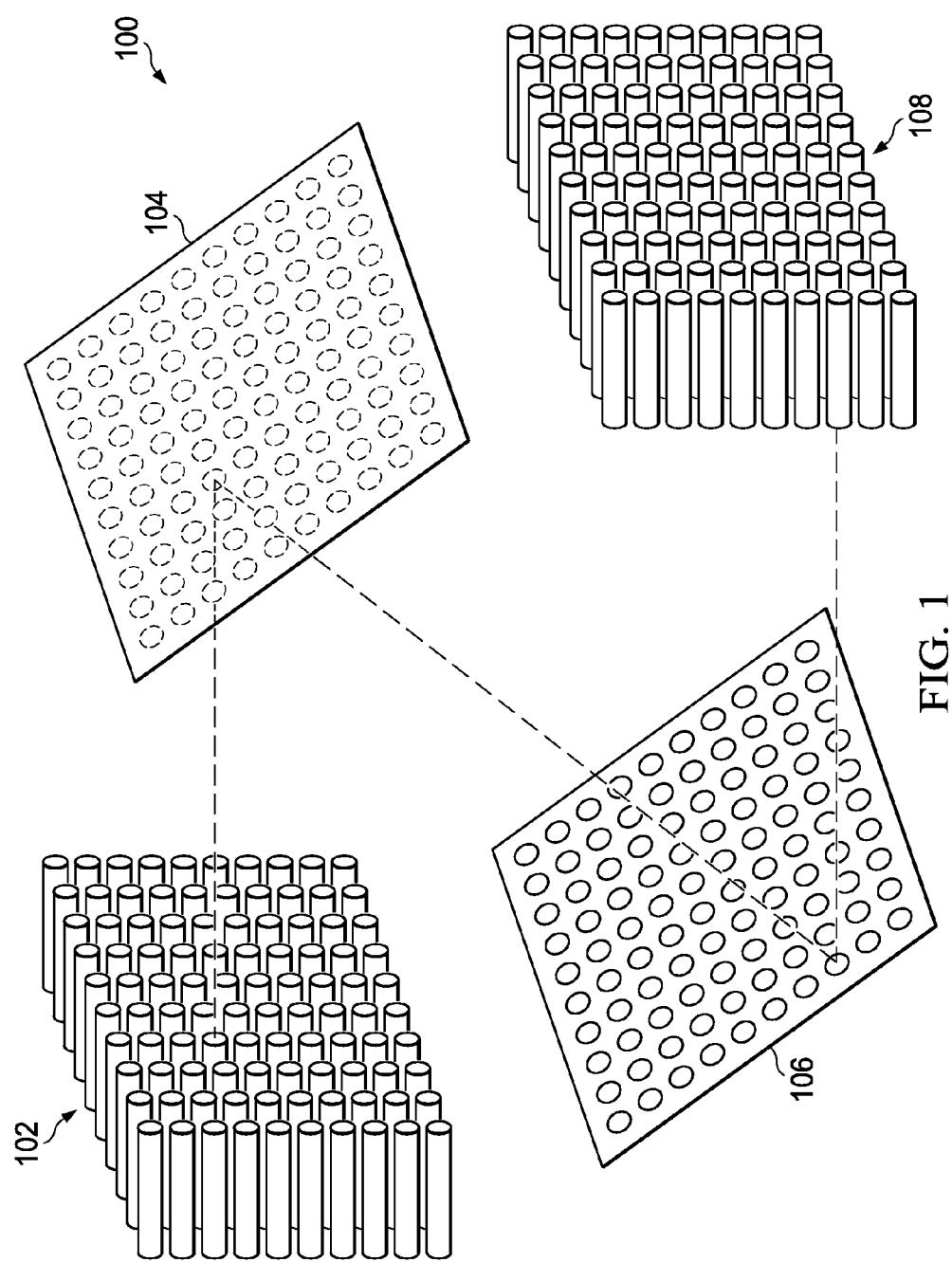
FIG. 1 illustrates an embodiment micro-electro-mechanical-system (MEMS) photonic switch.

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

In an embodiment, photodiodes are integrated on a micro-electro-mechanical-system (MEMS) mirror array in a photonic switch. An optical beam at a control wavelength propagates in both directions through the photonic switch. The optical control beam and the integrated photodiodes are used to align the mirrors of the mirror arrays to obtain initial alignment and to maintain alignment for in-service connections. Separate timeslots are used for obtaining initial alignment for connections and maintaining alignment for in-service mirrors so that the various alignments do not interfere with each other. A frame structure is used, where control light is applied in a different time slot for maintaining alignment of in-service mirrors and aligning new connections. In an additional example, the frame structure is used to permit multiple mirrors to be initially set up in different time slots within an initial alignment timeslot. The in-service mirrors are not locked for an extended time, while nearby mirrors are initially aligned. This may reduce the risk of vibration perturbation of those mirrors going uncorrected for an extended period of time.

The control light has a different wavelength than the traffic light. The control light for the various mirrors may be turned on and off in different timeslots. The length of a timeslot may be shorter than the minimum time for a MEMS mirror to move a significant amount from deliberate electrode drive signals or due to the effects of vibration. Some timeslots are used for maintaining the mirror alignment of existing connections, while some other timeslots are used for setting up new connections.

By aligning mirrors being set up with different timeslots than the timeslots used for in-service mirrors being maintained in position, the mirror set up does not interfere with the control of in service mirrors. Mirrors being set up may be isolated from each other by further sub-dividing the set up portion of the time-slots, facilitating all mirrors in the MEMS switch to be set up simultaneously. A control structure may be used with a MEMS mirror array that contains integrated photodiodes between the mirrors and/or on the mirrors.

A three-dimensional (3D) MEMS photonic switch may use one or two arrays of steerable mirrors to form switchable optical paths between collimator arrays. When one mirror array is used, the mirror array is arranged opposite a static planar or near planar retro-reflective mirror. In this example, the control wavelength propagates in both directions through the photonic switch, illuminating only the photodiodes around the second mirror encountered on each control carrier's path.

FIG. 1 illustrates MEMS photonic switch 100, a three dimensional (3D) MEMS photonic switch with two arrays of steerable mirrors. MEMS photonic switch 100 contains mirror arrays 104 and 106. Light enters via collimator array 102, for example from optical fibers, and impinges on mirrors of mirror array 104. Mirrors of mirror array 104 are adjusted in angle in two planes to cause the light to impinge on the appropriate mirrors of mirror array 106. The mirrors of mirror array 106 are associated with particular output ports of collimator array 108. Also, mirrors of mirror array 106 are adjusted in angle in two planes to cause coupling of the incoming beam from the appropriate mirror on mirror array 104 to the appropriate output port. The light then exits in a collimator of collimator array 108, for example coupling to optical fibers. Similarly, light enters collimator array 108, reflects off mirrors of mirror array 106, reflects off mirrors of mirror array 104, and exits through collimator array 102.

The mirror arrays have arrays of steerable 3D-MEMS mirrors (referred to here as MEMS mirrors) which reflect a beam projected onto them by an associated collimator. The reflected beam is then reflected on an opposing mirror on the opposing mirror array. Thus, an N×N MEMS photonic switching module contains N input mirrors, each of which can access any of N mirrors on the opposing mirror array, and vice versa. This enables the mirror count to grow linearly with the port count of the switch, utilizing 2N steerable mirrors for an N×N switch. For many other methods of building photonic switches, the mirror count or crosspoint count grows as the square of the port count. Thus, MEMS photonic switches are able to scale to a large port count, while some other approaches are limited by mirror count or crosspoint count. However, as the port count grows in a MEMS photonic switch, the suitable minimum optical path length between the mirrors and/or the suitable maximum mirror deflection angle increases.

Figure 2:
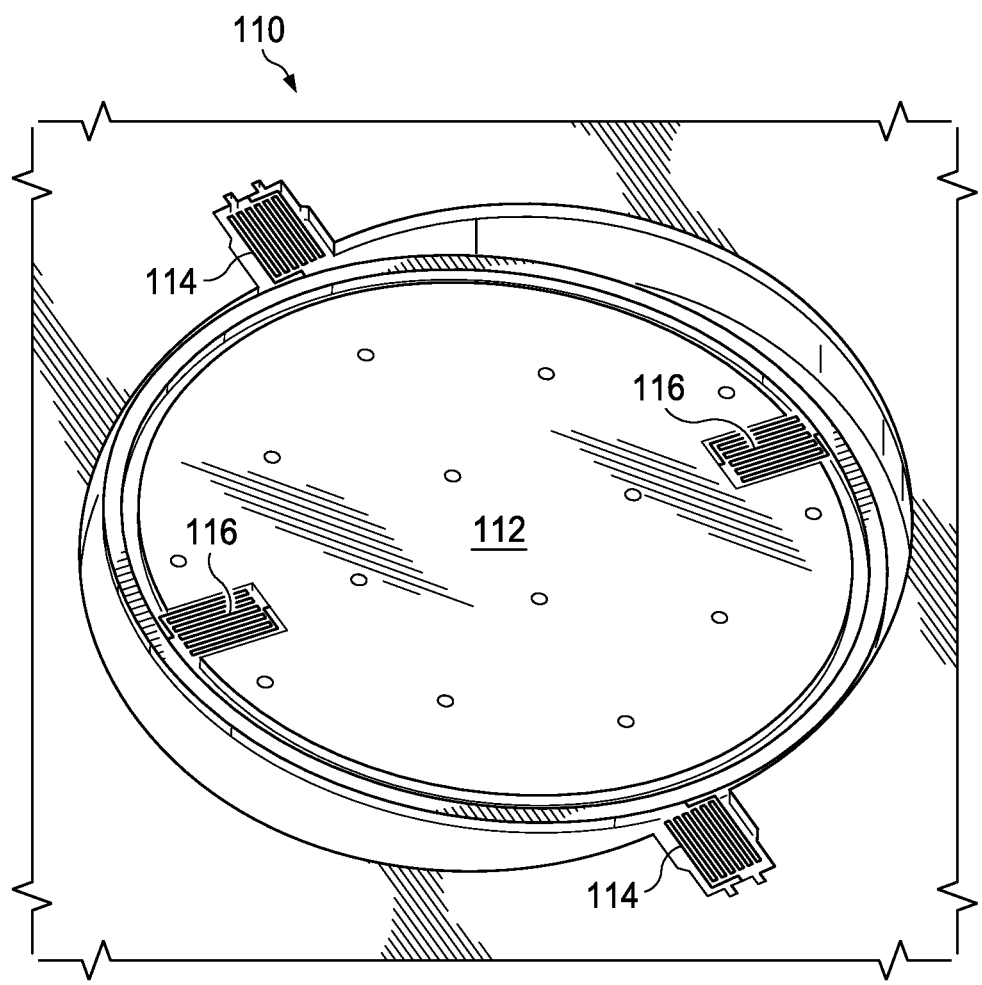
FIG. 2 illustrates an embodiment MEMS mirror structure.

The MEMS mirrors in MEMS photonic switch 100 are fabricated in a modified silicon wafer process. FIG. 2 illustrates an example MEMS mirror structure 110, which may have a diameter from about 550 μm to about 2.5 mm, for example around 1 mm. MEMS mirror structure 110 contains mirror 112 suspended on two axes of bearings 114 and 116 to allow it to tilt against the torsion spring actions of the bearings, which try to maintain mirror 112 in a particular position. Below mirror 112, at a distance of about 80 μm to 100 μm for a 1 mm mirror, are three or four segmented plate deflection electrodes. When four electrodes are used, each electrode may be associated with a mirror quadrant. When a voltage is applied to an electrode, mirror 112 is attracted towards that electrode by electrostatic attraction, and twists against the spring action of the silicon torsion springs. This deflection may be steered in both angular direction and magnitude by adjusting an applied drive voltage on one or more of the electrodes. Drive voltages may be up to a few hundred volts, with a maximum mirror deflection of five to seven degrees out-of-plane, for a maximum beam deviation of ten to fourteen degrees from the rest state, or a twenty to twenty eight degree peak to peak beam deviation.

Figure 3:
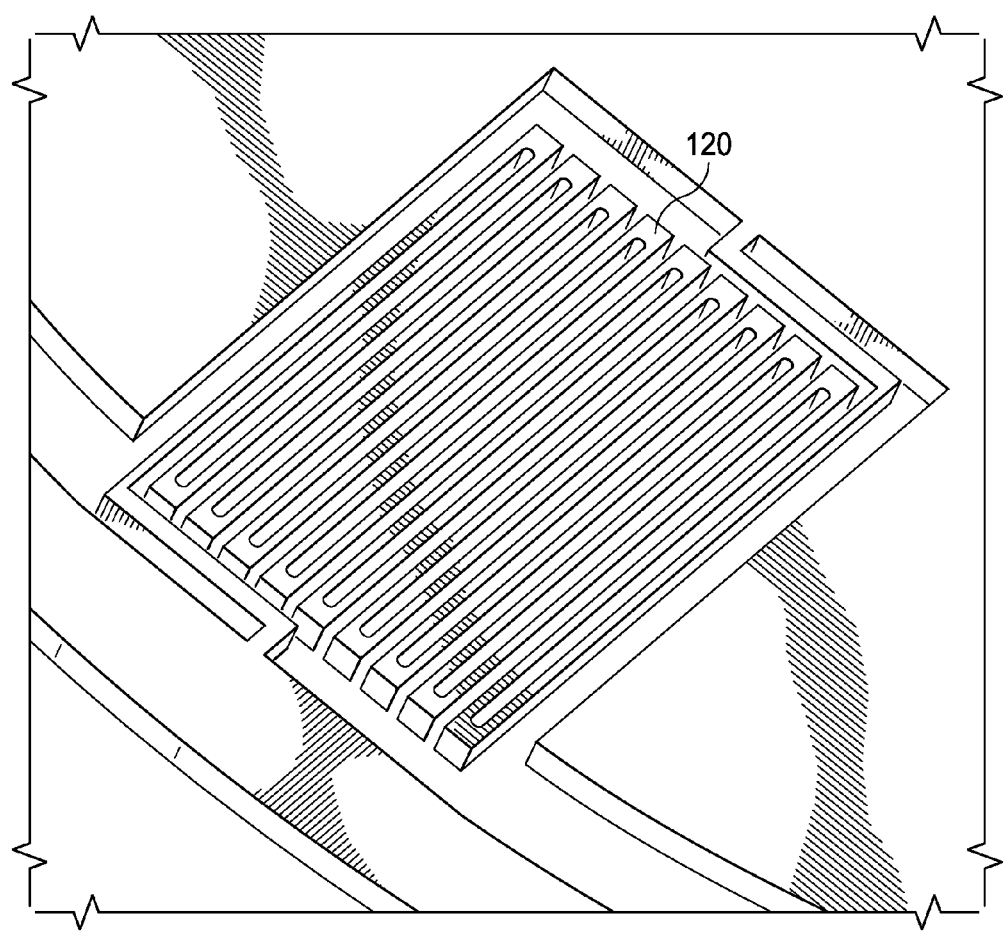
FIG. 3 illustrates an embodiment gimbal for MEMS mirrors.

FIG. 3 illustrates gimbal 120, an example of a gimbal that may be used as bearings 114 or bearings 116. Gimbal 120 may be fabricated from silicon torsion springs, which try to return the mirror to its planar position. The attractive force of the drive voltage on one or more quadrant electrodes versus the increasing spring tension forces as the mirror is moved determines the final pointing angle of the mirror.

Figure 4:
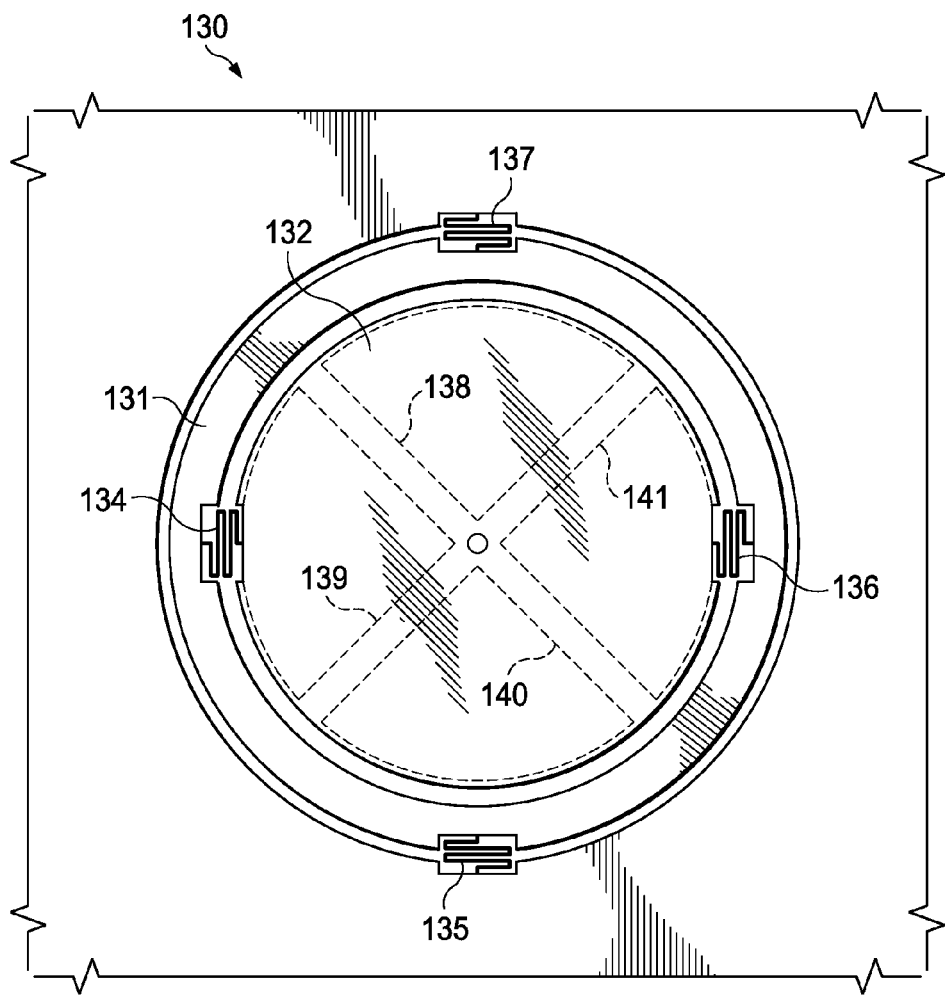
FIG. 4 illustrates another embodiment MEMS mirror structure.
Figure 5A:
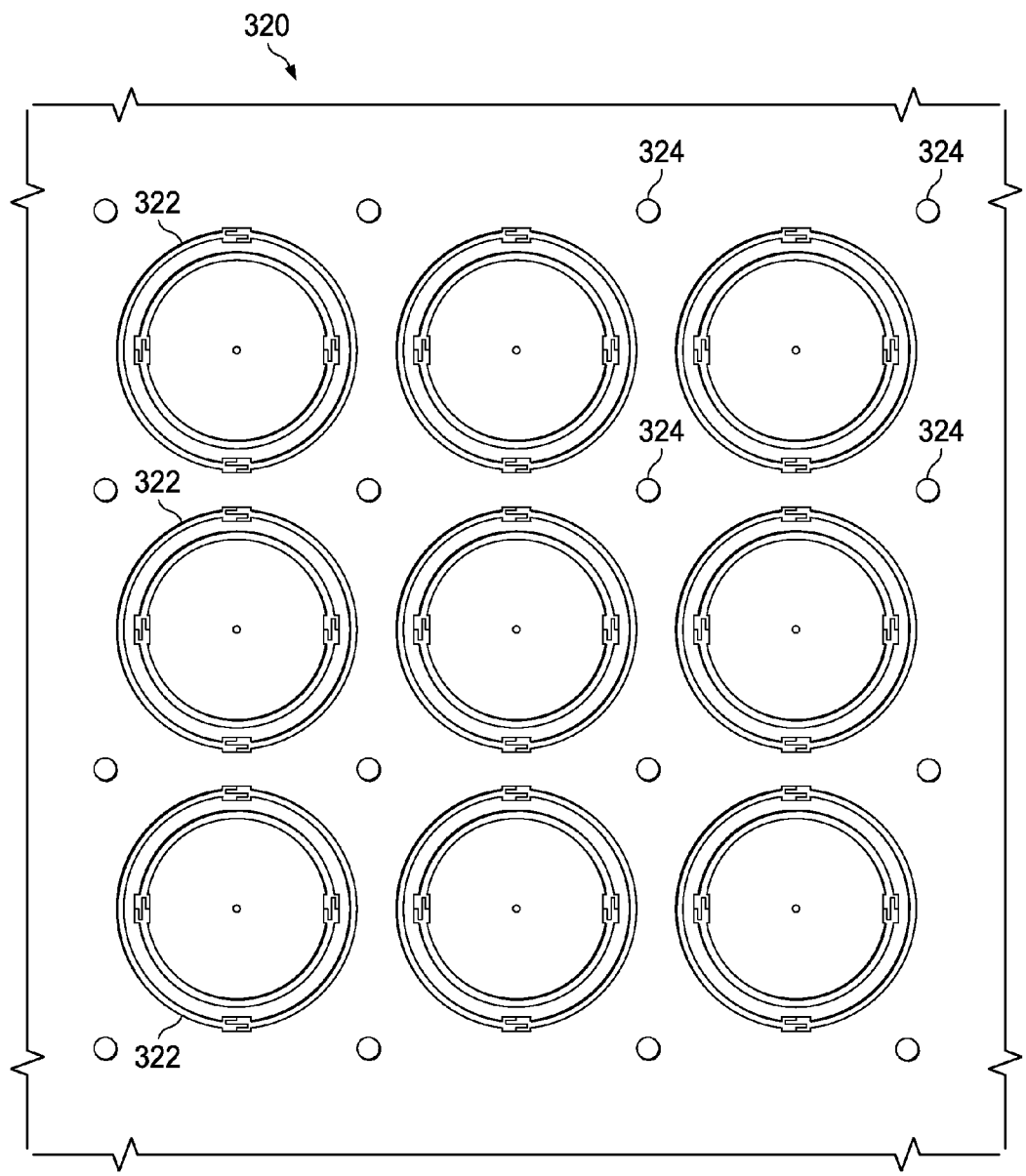
FIGS. 5A-E illustrate embodiment MEMS mirror arrays with interstitial photodiodes.
Figure 5B:
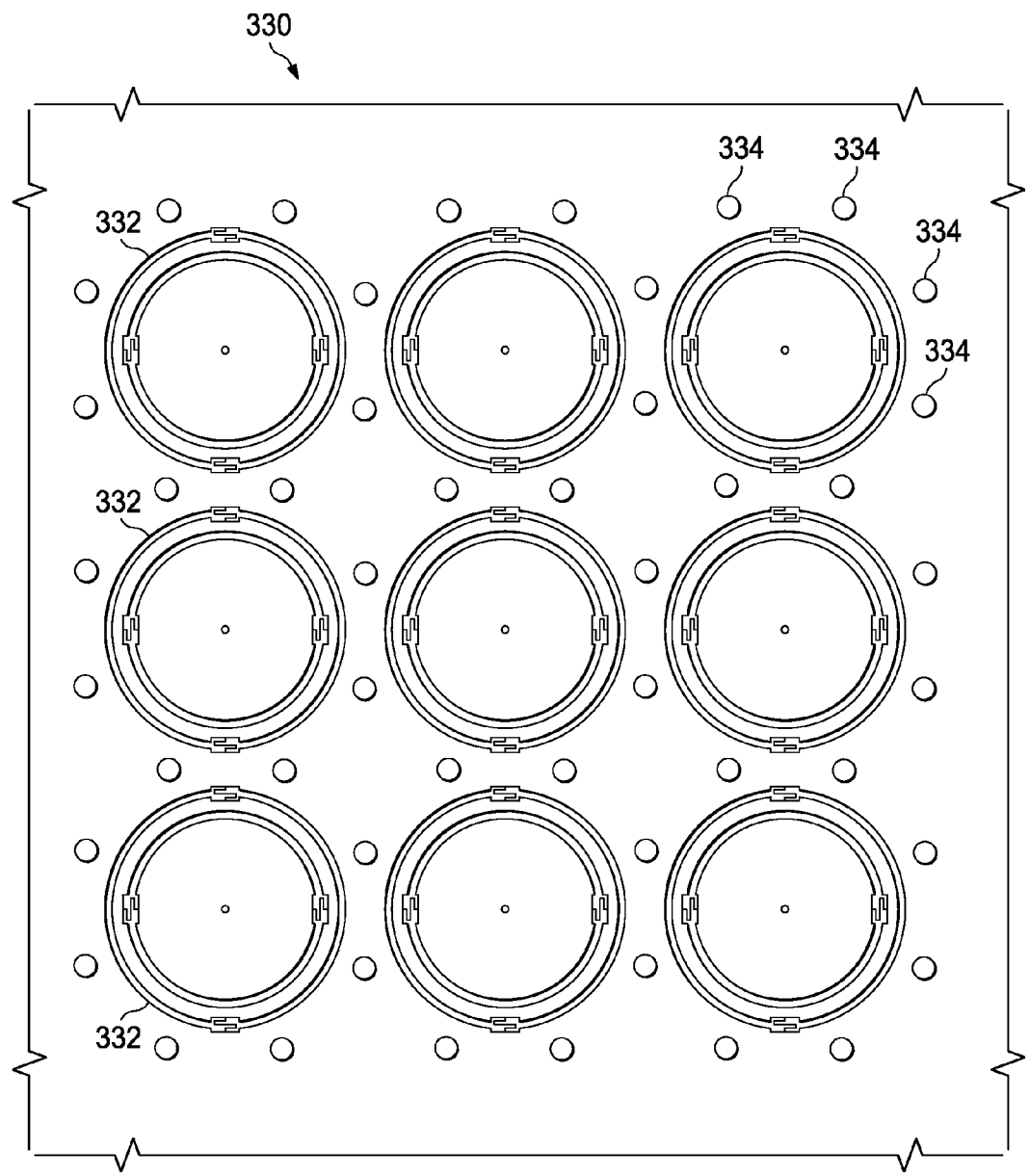
Figure 5C:
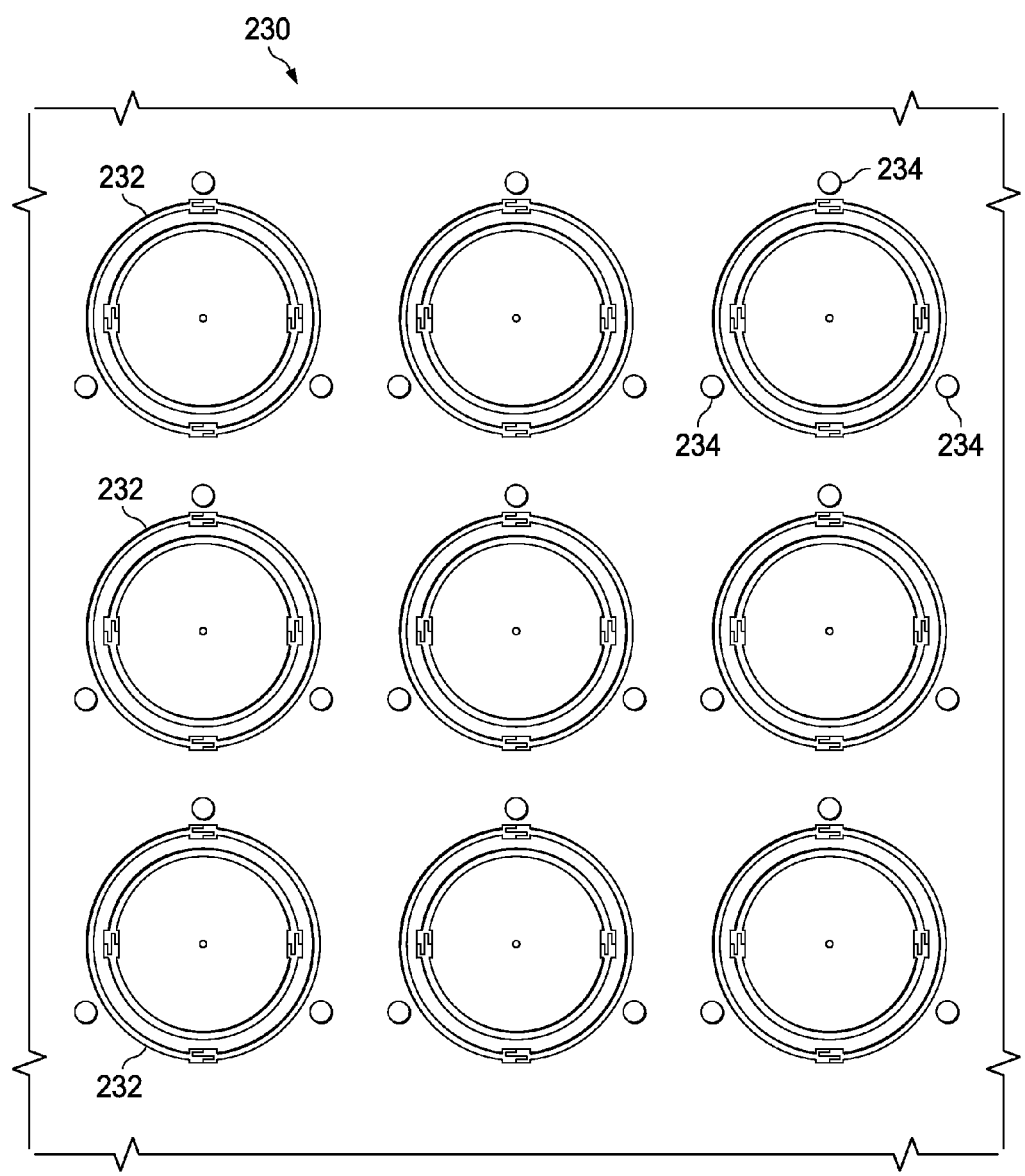
Figure 5D:
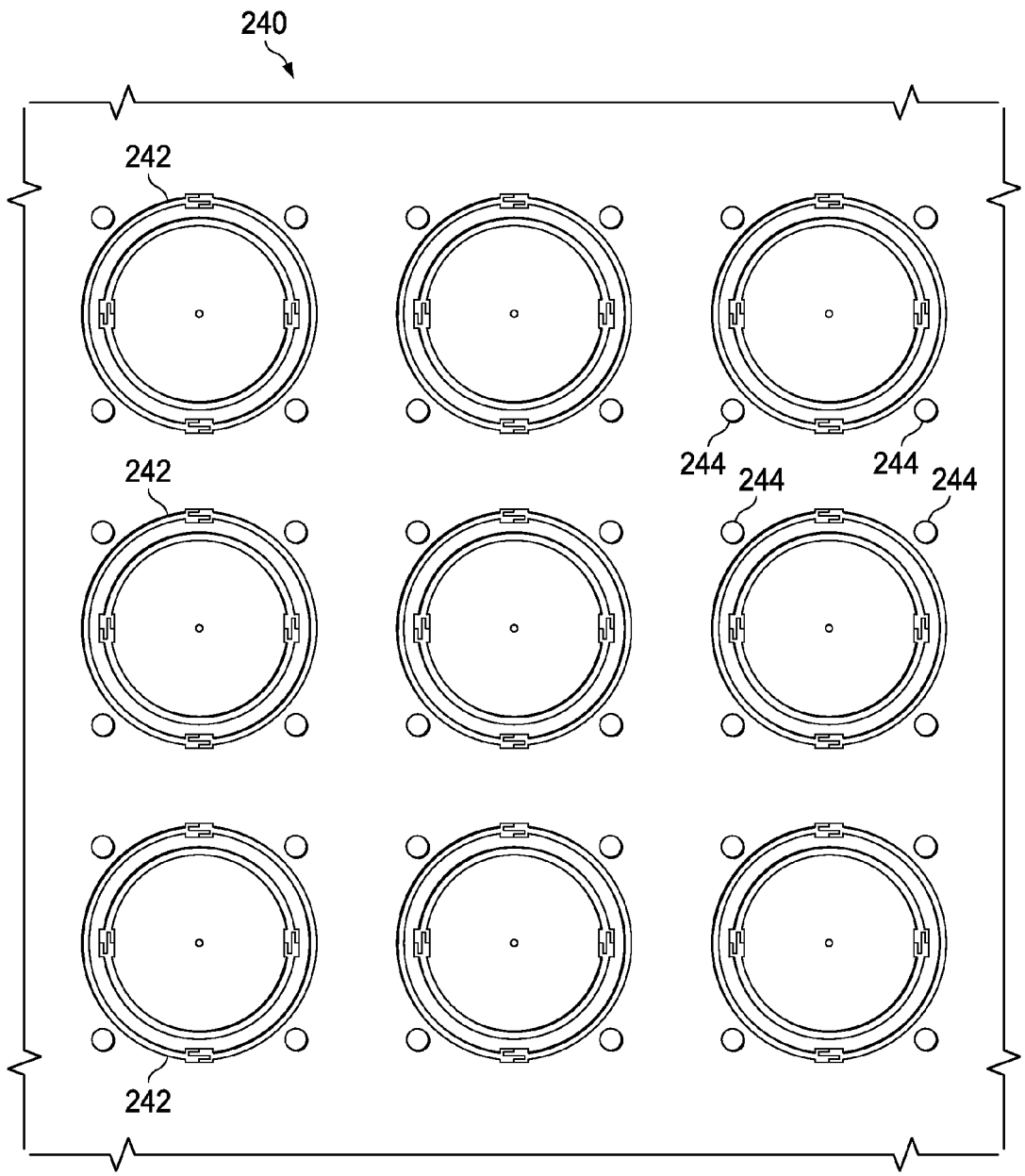
Figure 5E:
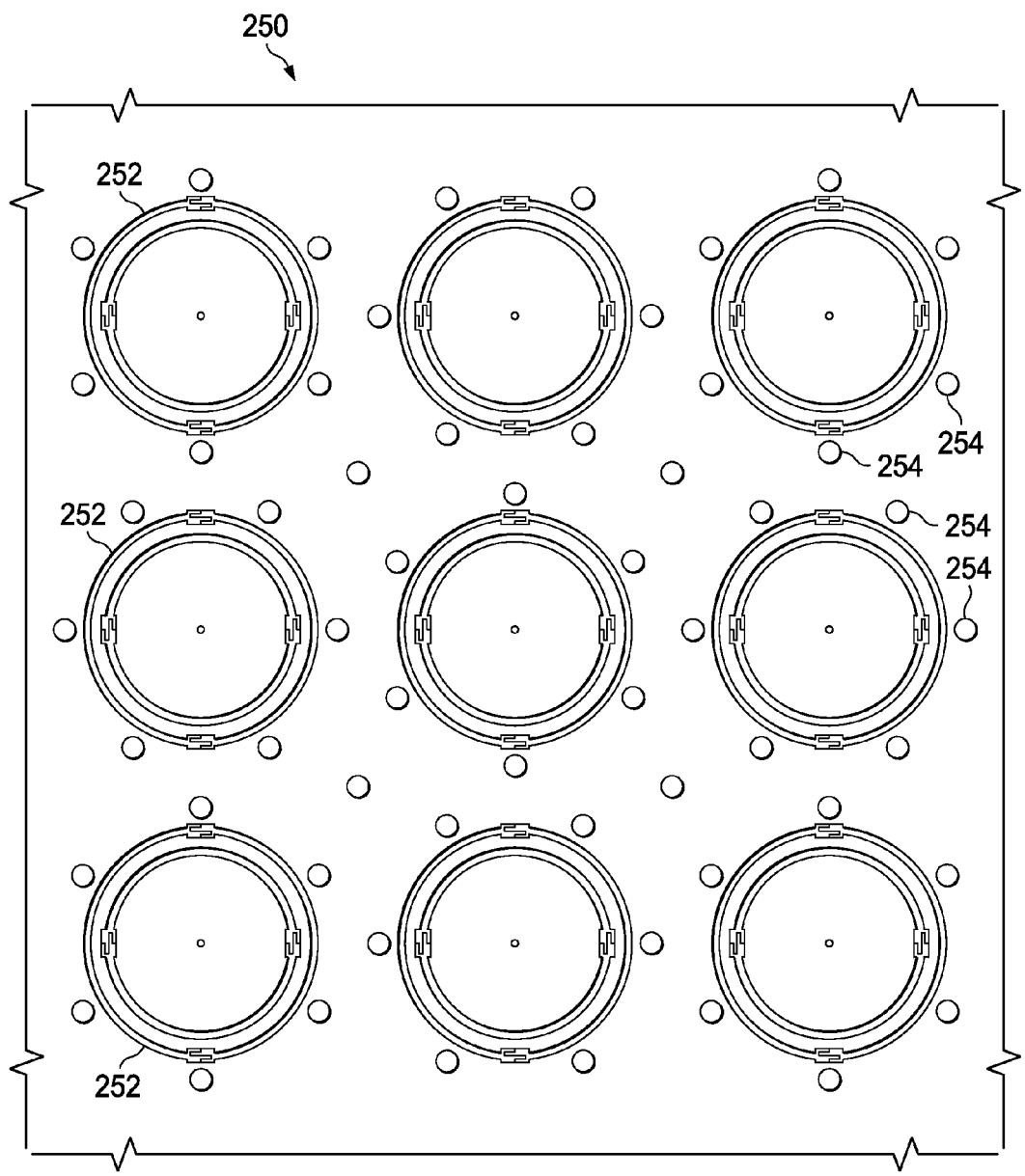

FIG. 4 illustrates mirror structure 130, which contains gimbaled moveable mirror 132 supported by a gimbal ring 131 with y-axis pivoting and x-axis pivoting. Movement in the x-axis is facilitated by springs 135 and 137 which act as pivots in one axis, and movement in the y-axis is facilitated by springs 134 and 136, which act as pivots in the orthogonal axis.

The deflection angle of the mirror is adjusted along these two axes, formed between springs 135 and 137, and between 134 and 136 by using quadrant electrodes 138, 139, 140, and 141. Applying a drive voltage to quadrant electrode 139 causes the mirror to be attracted toward that electrode, causing the mirror to twist against the spring action of springs 135 and 137, until the attractive force of the electrodes is balanced by the torsion force of the spring, resulting in a negative x mirror deflection. In a similar manner, drive voltages applied separately to quadrant electrodes 140, 141 and 138 can produce a negative y, positive x, or positive y deflection. The attractive force is proportional to the electric field (potential difference between the mirror and the electrode divided by the gap between the mirror and the electrode). Hence, for a ground potential mirror, the polarity of the electric field, and hence the drive voltage on the mirror, is insignificant, and the opposite pairs of electrodes are not driven differentially. However, one or the other of the electrodes in the x-axis and one or the other of the electrodes in the y-axis can be driven to produce deflection angles containing any combination of x and y components. The mirror can be pointed to "all points of the compass" by a suitable combination of x and y electrode drive voltages and "+"/"−" electrode selections.

An array of photodiodes is placed as an interstitial array between the mirrors in the mirror array to provide a detection grid of optical detectors across the mirror array. In an example, the photodiodes are associated with a particular mirror. FIGS. 5A-E illustrate example portions of MEMS arrays 320, 330, 230, 240, and 250 respectively. These arrays may be of any size, for example between 10×10 (100 mirrors per array) and 32×32 (1024 mirrors per array). In MEMS array with interstitial photodiodes 320, photodiodes 324 are arranged equidistant from four of mirrors 322, while in MEMS array with interstitial photodiodes 330, photodiodes 334 are arranged in a shared octagonal pattern around MEMS mirrors 332. Also, in MEMS array 230, photodiodes 234 are arranged in a modified triangular configuration around MEMS array 232, and in MEMS array 240, photodiodes 244 are arranged in a modified square pattern around MEMS mirrors 242. Additionally, in MEMS array 250, photodiodes 254 are arranged in a modified hexagonal pattern around MEMS mirrors 252. Other photodiode arrangements are possible. For example, five, seven, eight, or more photodiodes may be arranged around and associated with a MEMS mirror. The mirror arrays have a series of rows and columns of MEMS two axis steerable micromirrors, for example 0.5 to 1.5 mm in diameter.

Figure 6:
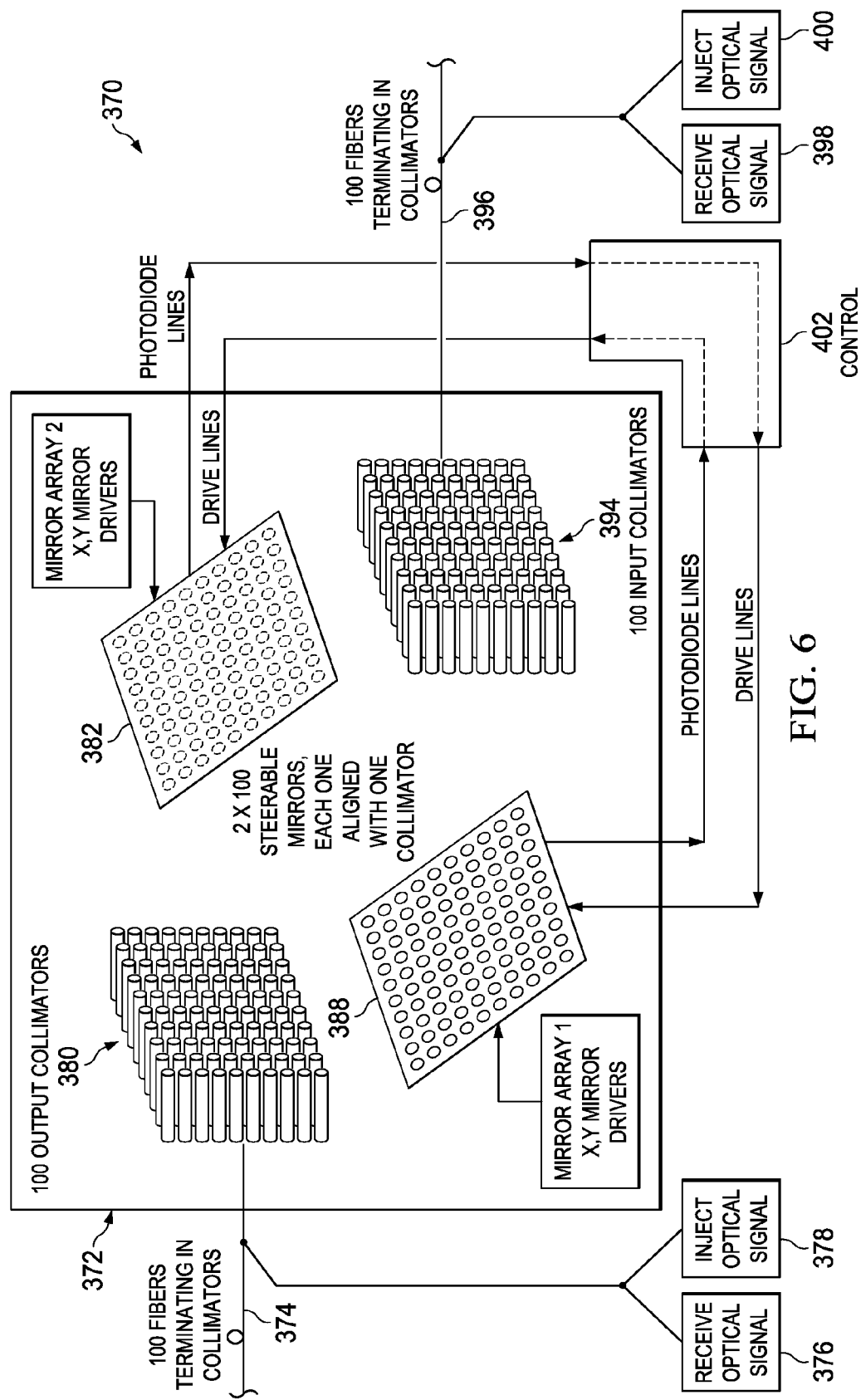
FIG. 6 illustrates an embodiment system with a MEMS mirror array with interstitial photodiodes.

FIG. 6 illustrates a MEMS system containing MEMS module 372. The mirror arrays 382 and 388 may be MEMS array 320, 330, 230, 240, 250, or other structures. The traffic light on optical fibers 374 and 396 is overlaid with control light at an out-of-band wavelength in both directions through the mirror chamber by coupling control light into the fiber on both the inputs and outputs. In an example, optical fibers 374 and 396 are single mode fibers at both the control wavelength and the traffic wavelength. The input fiber connections are terminated on an array of input collimators 380 that produce parallel beams of light from the light in the fiber. The input fiber collimators act as lenses, creating expanded parallel sided collimated beams of a diameter slightly smaller than the MEMS mirror diameter, for example, a beam diameter of 0.45-1.3 mm, at the traffic optical carrier wavelengths, which are projected on to mirrors the mirror array, for example mirror array 388. At the control wavelengths, these beams may be either slightly divergent or slightly convergent. When the control beams are convergent, the focal point is early in the optical path. After the focal point, the control beam is divergent. The output collimator block 394 is similarly aligned to mirror array 382. When light is injected in the output collimator, the parallel collimated beam center aligns with the center of the respective mirror. The collimators project a nominally parallel beam at traffic wavelengths if a reverse path traffic signal is present, but a convergent or divergent beam at the control optical carrier wavelength.

The mirror arrays and their respective collimator arrays are placed on either side of an empty optical cavity of sufficient size to enable each mirror on one mirror array to point a beam from its local collimator at each mirror on the opposing mirror array. Alternatively, the optical cavity has one or more large plane or curved mirror for folding long inter-mirror array optical paths into a smaller physical space.

The mirrors may be aimed or steered by applying a drive voltage to three or four segmented electrodes under the mirrors. The electrodes may be spaced about 80 to 100 microns from the mirrors. By applying different voltages to the segments, the mirrors may be pointed at an angle within their maximum deflection range. For example, the maximum deflection range may be about plus or minus five to seven degrees in both the x and y planes using the electrostatic forces from the applied electrode voltages to deflect the mirror against the spring tension of the gimbal mounts, which are trying to retain the mirror in its original plane. The drive lines to these electrodes are brought out of the mirror chamber.

The mirror arrays also contain photodiodes placed around the periphery of the MEMS mirrors. The photodiodes form a mesh of detectors across the face of the mirror array, facilitating the direct detection of an actual beam landing placement during the initial connection stages of switch connection establishment. The photodiodes act as mirror-associated optical control power sensors for the optimization and ongoing maintenance of an optimized link in service. The lines to these photodiodes are also tracked out. To avoid bringing out hundreds of low amplitude signals, the photodiode outputs may be amplified, digitized, and/or multiplexed in electronics physically associated on the mirror array. The on-array electronics may be on the front face of an extended mirror array substrate or on the reverse surface of the substrate, created by monolithic or hybridization techniques.

Controller 402 controls the opposite mirror via drive lines based on the output from the photodiodes from the opposing mirror. When the appropriate mirrors are aligned to form an optical path, the traffic beam will only illuminate the target mirrors and the output collimator face, but the coaxial expanded control beams will be evenly illuminating the photodiodes associated with the target mirror in the optical path. The photodiodes around the first mirror in the optical path are not illuminated, hence the need for a bidirectional control optical carrier feed to illuminate the first mirror. The measurement of the location of the beam spot provides the mirror pointing optimization detection during set up and ongoing maintenance.

Bidirectional control beams facilitate the simultaneous and independent initial alignment of opposing mirrors in the optical path, so the control beams are illuminating photodiodes around the opposing target mirror evenly. Thus, the mirror chamber module contains two banks of collimators which are precision aligned with the mirrors of their respective mirror arrays, such that light from the fibers of the collimator arrays form a beam with a central axis which passes through the center of their respective mirrors of the mirror arrays. These collimator arrays project collimated beams at traffic optical wavelengths and coaxial beams at the control optical wavelengths. The traffic beams may be parallel beams or very slightly waisted to compensate for Gaussian beam spread.

When a control beam from the input collimators is reflected by the first mirror it is projected on or near the target mirror on the second mirror array. The first mirror has a diameter sufficient to reflect the traffic beam and the control beam. The photodiodes around the target mirror or nearby mirrors within the zone of uncertainty determine the resultant beam spot placement. The zone of uncertainty is a zone around a target mirror where the beam may initially land, for instance as a result of an initial blind calculated mirror pointing. The photodiode response enables a control system to compute the landing positional error and a correction vector to better align the traffic beam. When the mirror is aligned, the target mirror's photodiodes are approximately equally illuminated by the control beam. A change in this uniform illumination may be rapidly compensated for by the control system to maintain alignment during operation.

Inject optical signal blocks 378 and 400 and receive optical signal blocks 376 and 398 are coupled to MEMS module 372. Receive optical signal blocks 376 and 398, which are optional, confirm that the cross switch optical loss is low when the mirrors are correctly aligned. Also, receive optical signal blocks 376 and 398 are useful if the control optical channel is modulated at the input with an identity marker or identity word specific to a given input. The control optical receiver on the target output port can confirm the receipt of that identity marker or word validating the cross-switch connection mapping.

Inject optical signal blocks 378 and 400 are optical alignment sources which are injected from opposite sides of the system and counter-propagate across MEMS module 372. The optical alignment source is injected into the fibers, for example using an optical combiner. The optical alignment sources contain light from one or more lasers. A dedicated laser is not necessary, because the control power may be low relative to a laser's power output, as one laser can drive multiple inputs via an optical splitter. Optical fibers 374 and 396 are single mode at both the control wavelength and the traffic wavelength. The control wavelength may be a shorter wavelength than the traffic wavelength. For example, the control wavelength may be in the 800-850 nm or 905-1040 nm bandwidth range when traffic is in the 1550 nm telecommunications band or the 1300 telecommunications band.

Figure 7:
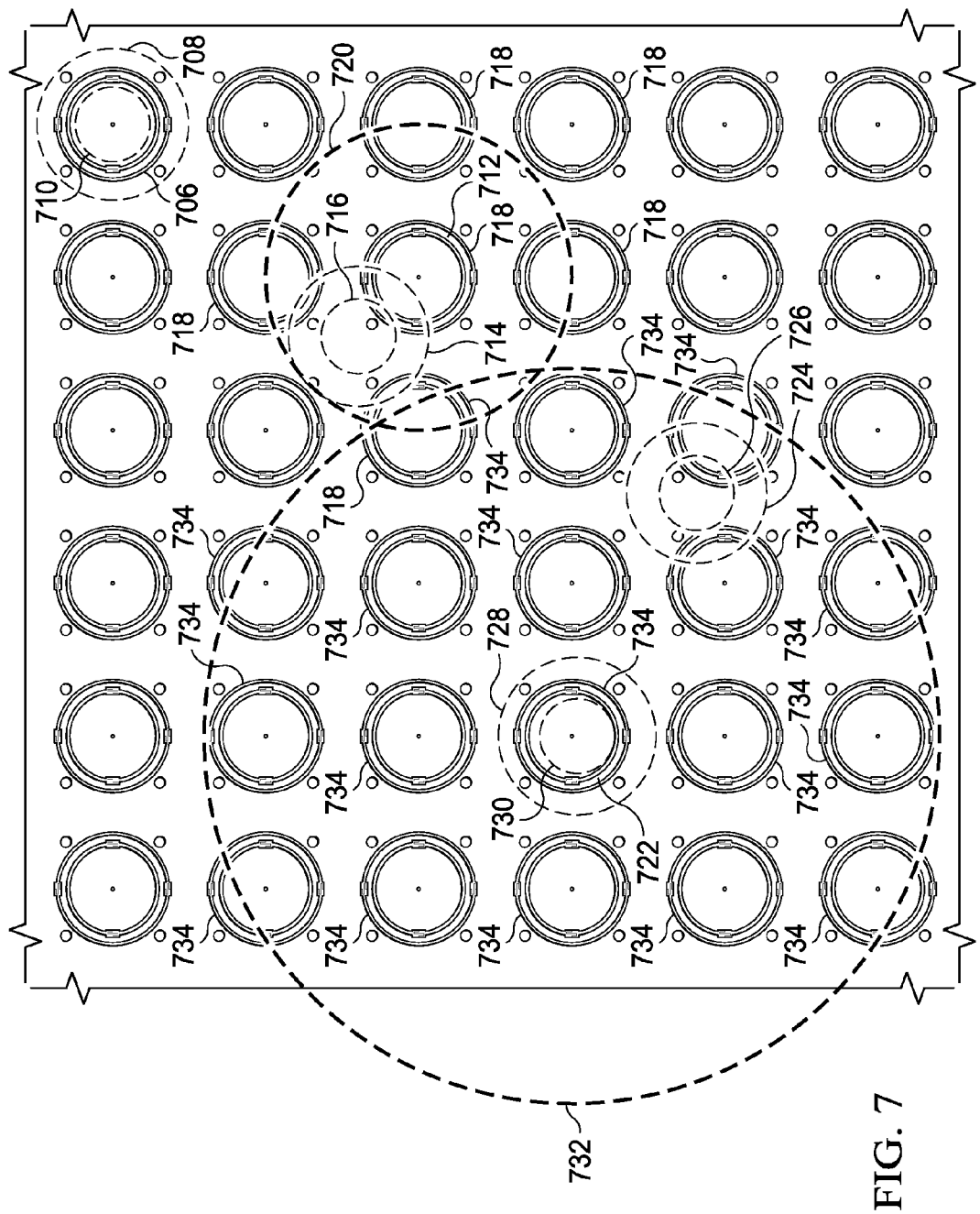
FIG. 7 illustrates beam spots on an embodiment MEMS array with interstitial photodiodes.

FIG. 7 illustrates a mirror array with interstitial photodiodes and some examples of beam landing spots. Traffic beam 710 and control beam 708 are properly aligned on mirror 706. This alignment is unlikely to occur from the initial calculation, due to its approximate nature, but represents the goal for after the acquisition and optimization process has been applied.

In one example, control beam 714 partially illuminates the target mirror, mirror 712. Traffic beam 716 is coaxial with control beam 714. The location of control beam 714, and hence traffic beam 716, can be determined by the light detected by photodiodes within zone of uncertainty 720. The mirrors on the opposing substrate beaming on to mirrors within zone of uncertainty 720 and mirrors 718 within zone of uncertainty 720 are locked. The photodiodes illuminated and the relative amount of power detected enables the calculation of a correction vector to be calculated in terms of distance and angle to center the beam on mirror 712. In this example, the beam primarily falls on photodiodes to the left of and above mirror 712, with the most power falling on the photodiode closest to the mirror. Three photodiodes are illuminated. The information from these photodiodes leads to the determination that the beam landing site should be moved to the right and down as a vector angle, and that it needs to be moved about a beam diameter to be better aligned with the target mirror. This calculation can be based on the photodiode that receives the most light, where the vector is approximately from that photodiode's location to the center of the target mirror. In another example, the power received by all three illuminated photodiodes is used to more accurately determine the center of the beam by triangulation. When multiple photodiodes are used, the alignment may be performed more precisely, often in a single cycle. Then, during operation, the optimization is maintained against mirror drift by monitoring the photodiodes around the mirror. When fewer than three photodiodes are used, the beam is subsequently more accurately centered using the photodiodes associated with mirror 712 as an additional step.

In an example with a broader tolerance for the initial beam pointing, control beam 724 and traffic beam 726 initially land further away from mirror 722, within zone of uncertainty 732. Mirrors 734 and the mirrors on the opposite substrate beaming on to mirrors 734 within zone of uncertainty 732 are locked during the initial alignment, freeing the mirror-associated photodiodes in the zone of uncertainty 732 for power detection measurements of the beam being set up.

This is measured as an incremental power in addition to the received power from the locked control beams. The photodiodes in the area where the beam landed respond to the received control illumination of the beam 724 which is being set up. The detected illumination values are used to calculate the center of the beam landing site, either approximately using the photodiode that receives the most light or, more accurately using three or more photodiodes to determine the actual location of the center of the beam. A correction vector may be calculated to achieve approximate or accurate alignment with the target mirror. This should bring the beam close to being aligned. For example, traffic beam 730 and control beam 728 are close to being aligned with mirror 722. If an error remains that is detectable among the photodiodes around mirror 722, a second small correction vector may be calculated.

Additional details on a MEMS photonic switch with interstitial photodiodes are disclosed by the U.S. patent application Ser. No. 13/964,437 entitled "Device and Method for Micro-Electro-Mechanical-System Photonic Switch" filed on Aug. 12, 2013 which application is hereby incorporated herein by reference.

Figure 8:
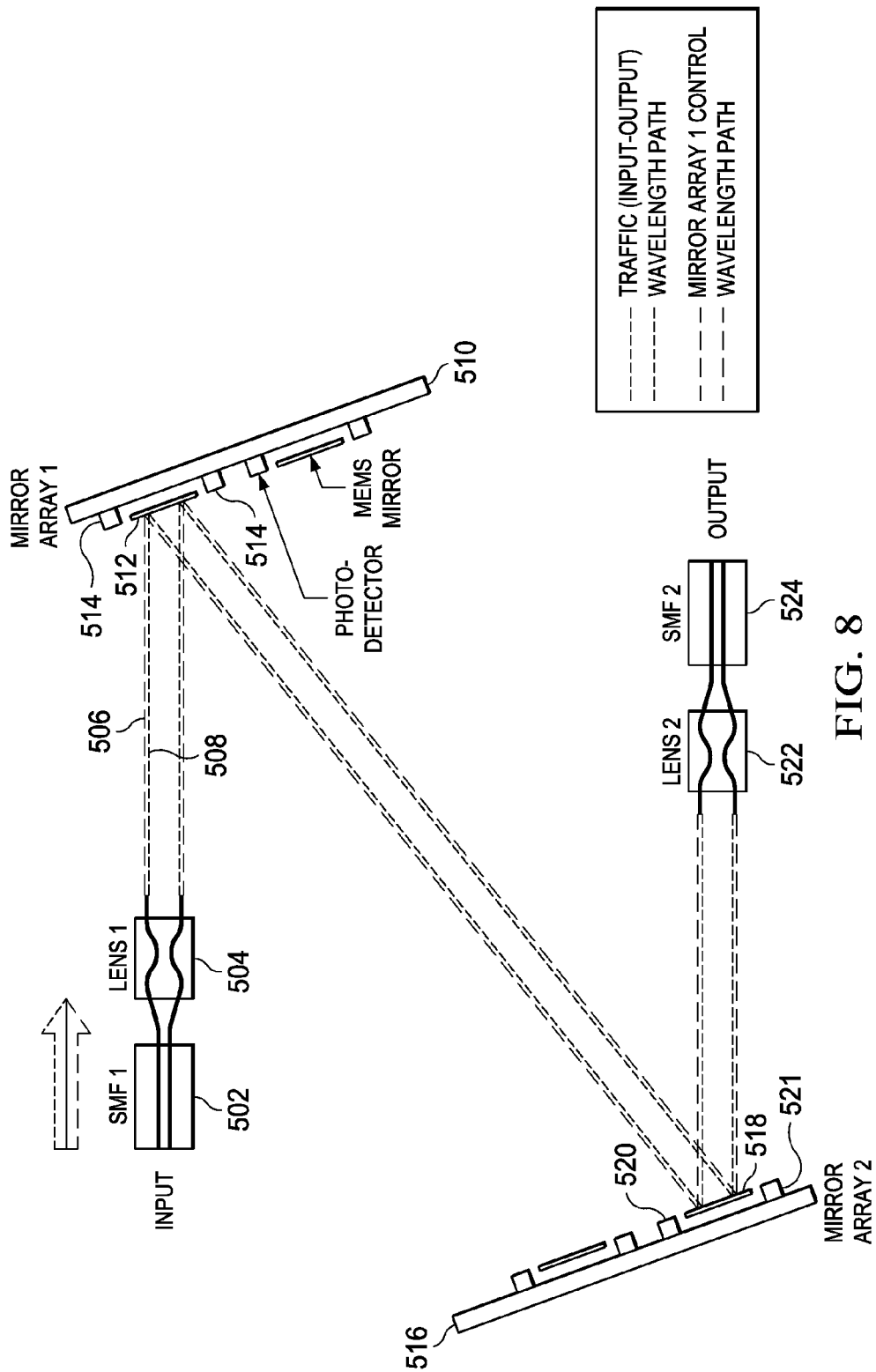
FIG. 8 illustrates an embodiment MEMS module with achromatic collimators.

FIG. 8 illustrates a traffic beam and a control beam projected as collimated beams across a MEMS switch. Control beam 506 and traffic beam 508 enter through single mode fiber 502 and lens 504 and are projected on mirror 512 of mirror array 510. Photodiodes 514 are around mirror 512. Control beam 506 and traffic beam 508 are reflected off mirror 512 to mirror 518 on mirror array 516, with photodiodes 520 and 521 surrounding mirror 518. The two beams exit through lens 522 to single mode fiber 524. Photodiodes 514, 520 and 521 are not illuminated when control beam 506 and traffic beam 508 are centered on mirrors 512 and 518, respectively, because lens 504 and lens 522 are achromatic.

Figure 9:
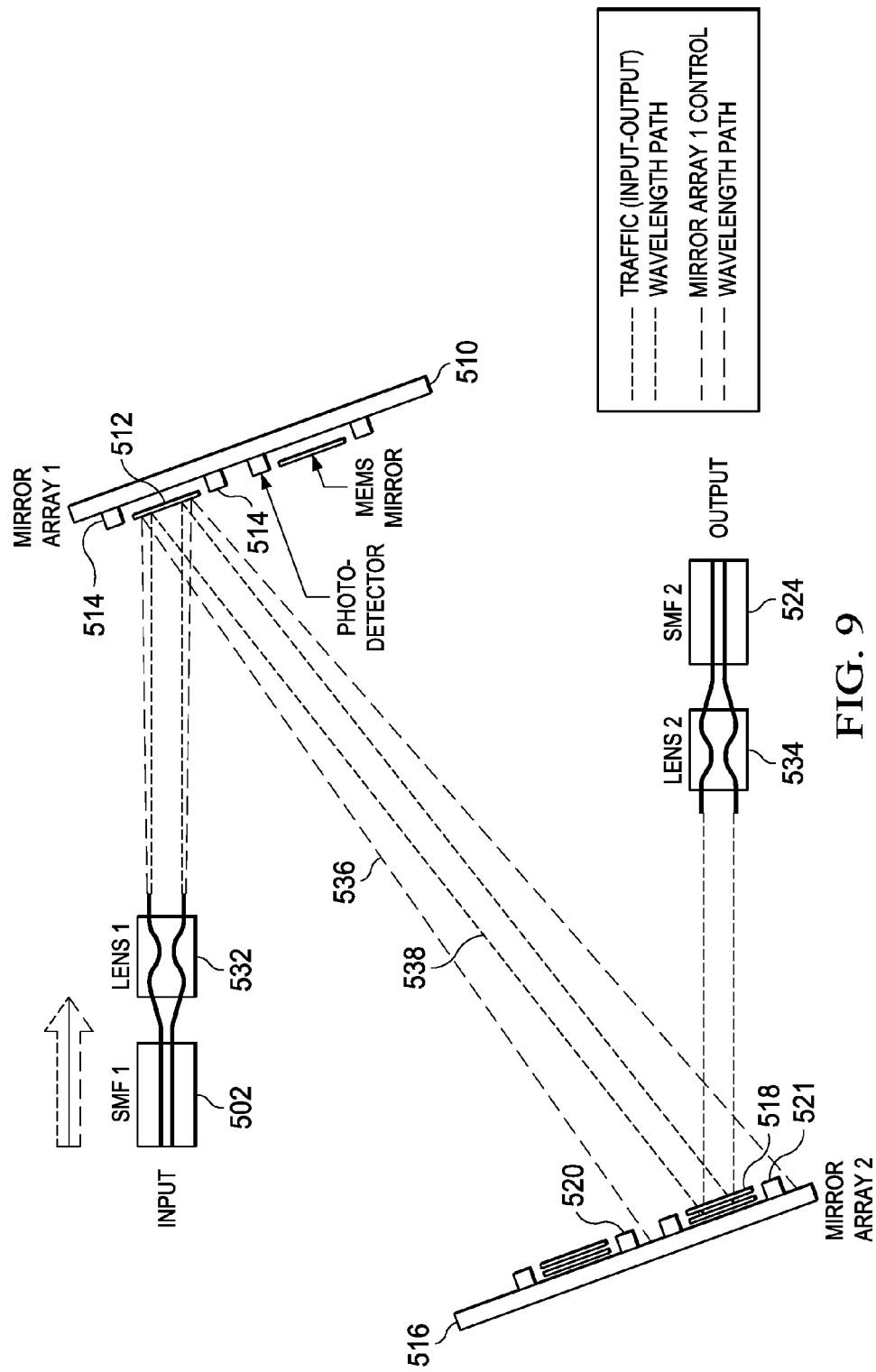
FIG. 9 illustrates an embodiment MEMS module with a longer effective focal length at a control wavelength than at a traffic wavelength.

FIG. 9 illustrates traffic beam 538 and control beam 536 where control beam 536 is slightly divergent. Control beam 536 and traffic beam 538 enter through single mode fiber 502 and lens 532. Lens 532 causes control beam 536 to diverge relative to traffic beam 538, while the beams remain coaxial. Control beam 536 and traffic beam 538 reflect off mirror 512 in mirror array 510 to mirror 518 on mirror array 516. Control beam 536 diverges to illuminate photodiodes 520 and 521 when control beam 536 and traffic beam 538 are centered on mirror 518, while traffic beam 538 does not illuminate photodiodes 520 and 521 when centered on mirror 518. Control beam 534 and traffic beam 538 then exit through lens 532 to single mode fiber 524. Because of the divergence of control beam 536 in the path to mirror 512, mirror 512 sufficiently large to accommodate the increase in spot size.

The difference in the illumination of photodiodes 520 and 521 generates a control vector to steer the beam by adjusting mirror 512 to minimize the differences in the control beam power received on photodiodes 520 and 521 associated with mirror 518. When traffic beam 538 and control beam 536 are centered on mirror 518, the power on the photodiodes is approximately equal, because the traffic beam is coaxial with the control beam. Because the beam spots are coaxial and centered, a similar amount of power is detected by photodiodes 520 and 521.

In a misalignment example, control beam 536 and traffic beam 538 are offset from the center of mirror 518, and more light might be detected by photodiode 520 than by photodiode 521. When three or more diodes are illuminated, the beam location may be determined by triangulation. Because the beams are coaxial, the traffic beam will be aligned when the control beam is aligned.

Because photodiodes 520 are illuminated when traffic beam 538 is centered on mirror 518, the signals generated from photodiodes 520 may control optimization during in-service operation as well as the initial alignment. The photodiodes associated with the target mirror are used for fine alignment, while other photodiodes within a zone of uncertainty are used for initial course alignment. Other mirrors within the zone of uncertainty may be locked during the initial alignment. The mirrors may be locked, for example for 5-10 ms, which is shorter than the time period for locking when precession is used for coarse alignment. Locking is achieved by maintaining the current X, Y drive voltages on the opposing mirrors, irrespective of control input from the target mirror photodiodes surrounding the mirrors within the zone of uncertainty. This frees up the mirror-associated photodiodes within the zone of uncertainty to be used as a detection grid for the new beam location.

Figure 10:
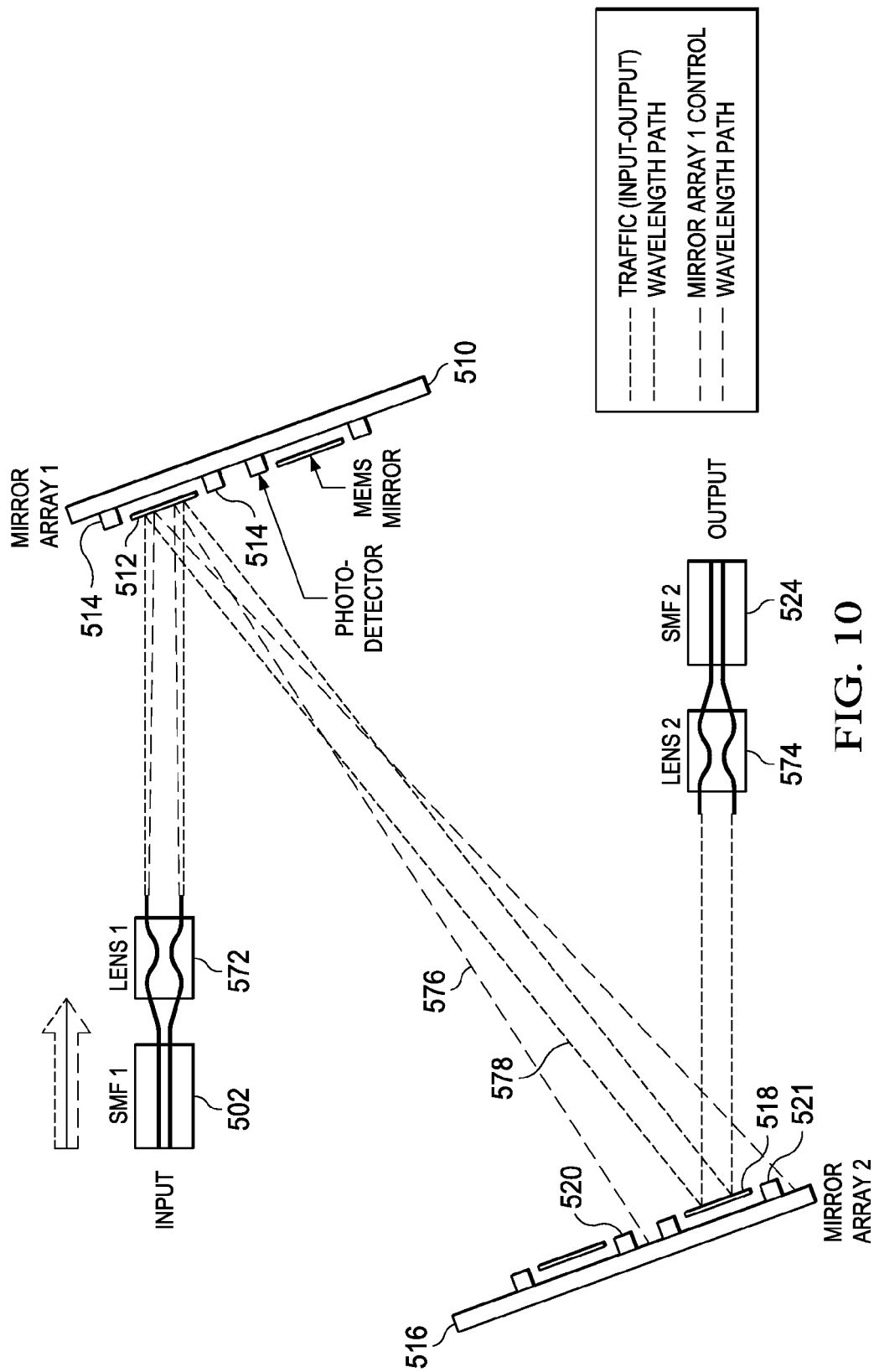
FIG. 10 illustrates an embodiment MEMS module with a shorter effective focal length at a control wavelength than at a traffic wavelength.

FIG. 10 illustrates an optical link where the control beam is slightly convergent and coaxial with the collimated traffic beam. When the focal point is well before the second mirror array, the control beam spreads out beyond the focal point and illuminates the photodiodes surrounding the second mirror. The difference in power detected by the photodiodes around the mirrors can generate a control vector to steer the beam by adjusting the first mirror to minimize the differences in control beam power received by the photodiodes. When the control power on the photodiodes associated with the mirror is equal, the control beam, and hence the traffic beam is centered. Because the traffic beam is coaxial with the control beam, they are both centered with the same alignment. In this example, the mirror diameter does not need to be increased to handle the control beam, because control beam 576 is smaller than traffic beam 578 at mirror array 510.

Traffic beam 578 and control beam 576 enter through single mode fiber 502 and lens 572. Lens 572 converges control beam 576, while traffic beam 578 is collimated. The beams reflect off mirror 512 on mirror array 510 to mirror 518 on mirror array 516. The beams exit through lens 574 and single mode fiber 524.

Because photodiodes 520 are illuminated by control beam 576 when traffic beam 578 is centered on mirror 518, the signals generated from photodiodes 520 may control the optimization during in-service operation as well as the initial set up operation during fine alignment. Photodiodes associated with mirrors across the zone of uncertainty may be used to detect the initial beam placement. If necessary, the mirrors within the zone of uncertainty are locked in position.

Additional details on collimators that have a different focal length at a control wavelength and a traffic wavelength are disclosed by the U.S. patent application Ser. No. 14/086,794, entitled "Device and Method for Micro-Electro-Mechanical-System Photonic Switch" filed on Nov. 21, 2013, which application is hereby incorporated herein by reference.

Figure 11:
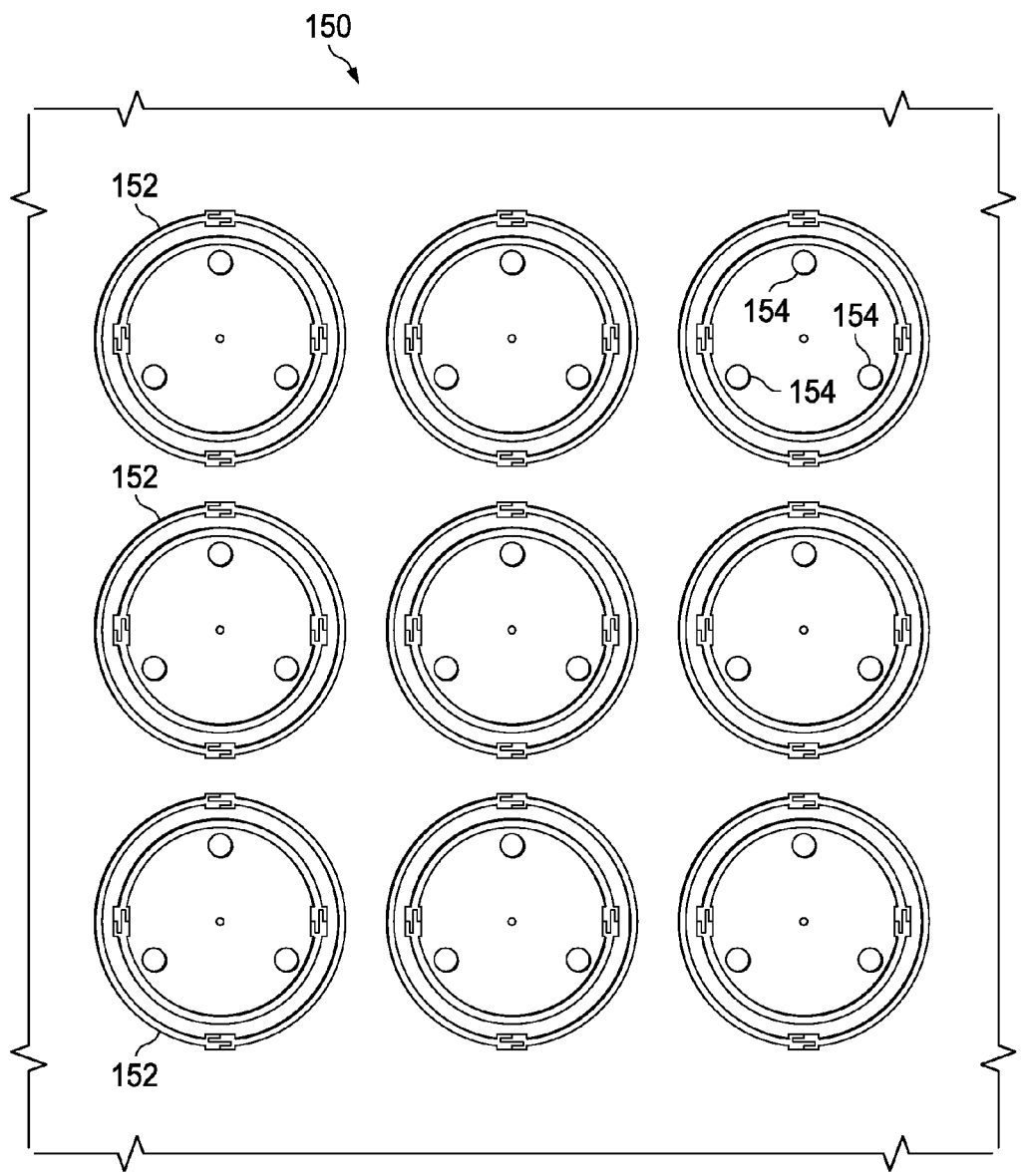
FIG. 11 illustrates an embodiment MEMS mirror array with photodiodes integrated on the mirrors.

In another example, photodiodes are integrated on the surface of the MEMS mirrors FIG. 11 illustrates MEMS mirror array 150 of MEMS mirrors with photodiodes integrated on the mirror surface. MEMS mirror array 150 contains MEMS mirrors 152, with photodiodes 154 integrated on the surface of the mirrors.

Figure 12A:
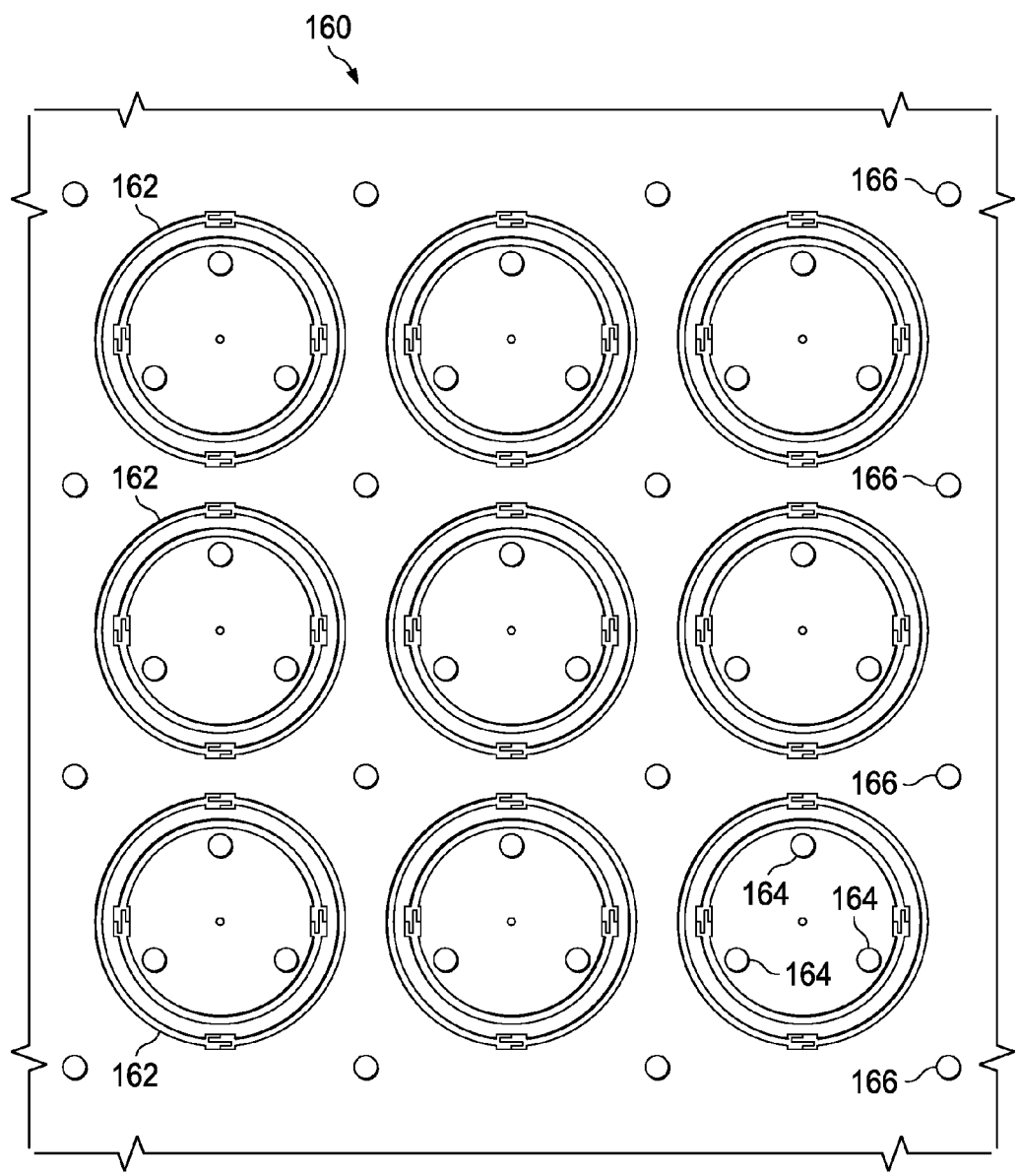
FIGS. 12A-C illustrate embodiment MEMS mirror arrays with interstitial photodiodes and photodiodes integrated on the mirrors.

FIGS. 12 A-C illustrate MEMS mirror arrays with photodiodes placed on the substrate between the mirrors in a mirror array as well as on the surface of the mirrors. Mirror array 160 in FIG. 12a shows mirrors 162 with photodiodes 164 placed on the surface of mirrors 162 and photodiodes

Figure 12B:
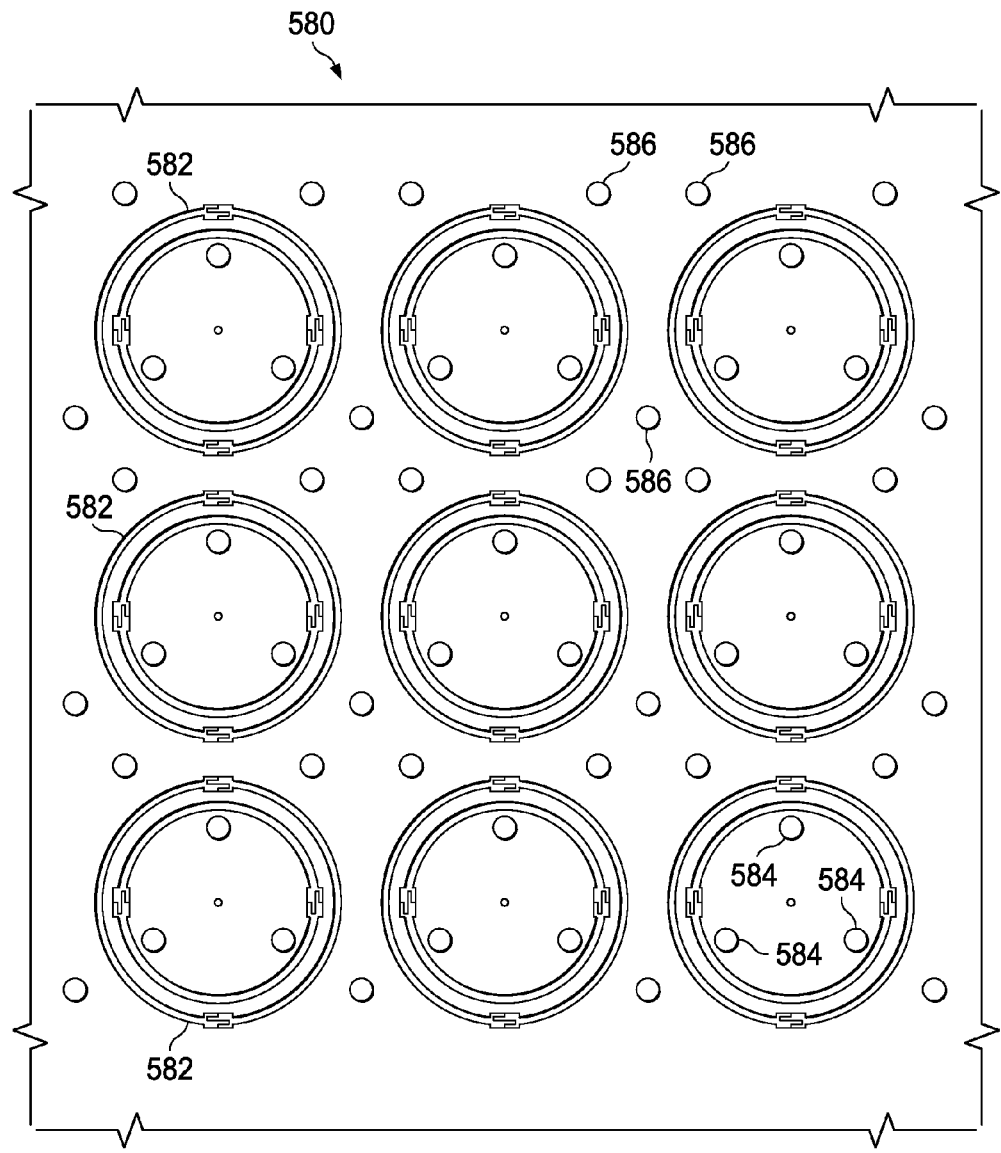
Figure 12C:
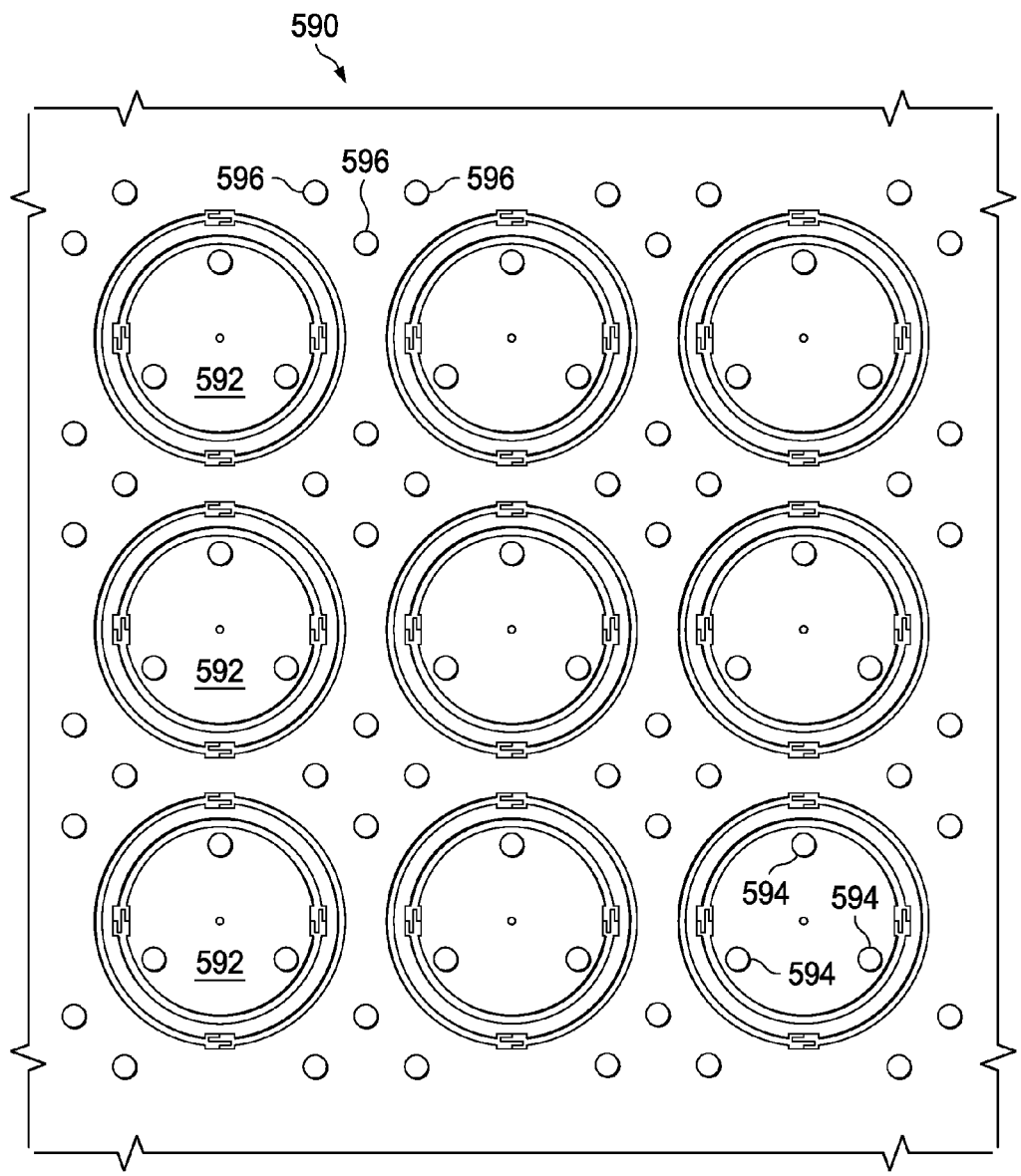

166 equally spaced between four surrounding mirrors. FIG. 12*b* shows mirror array 580 with mirrors 582, photodiodes 584 placed on the surface of mirrors 582, and photodiodes 586 placed in a triangular pattern centered equidistant from the centers of the four surrounding mirrors. Also, FIG. 12*c* shows mirror array 590 with mirrors 592, photodiodes 594 on the surface of mirrors 592, and photodiodes 596 in a diamond pattern centered equidistant from the centers of the four surrounding mirrors. Other photodiode patterns may also be used. For example, more interstitial photodiodes may be used. The photodiodes may be placed in the region between two mirrors rather than centered between four mirrors.

The interstitial photodiodes assist the mirror photodiodes in determining the center of the initial beam placement. This may be determined accurately with three or more photodiode responses and triangulation of the beam site center. When only one photodiode is illuminated by the initial beam landing, its location within the beam spot cannot be determined. While the beam spot distance may be calculated, the direction of the center of the beam spot from that photodiode cannot be calculated. Hence, the photodiode location may be used as the beam location, which leads to a more approximate correction vector. Once light is received by any of the mirror photodiodes on the target mirror, the beam may be walked in to the mirror center.

Additional details on MEMS mirror arrays with photodiodes placed on the surface of the MEMS mirrors are disclosed by the U.S. patent application Ser. No. 17/472,167 entitled "Device and Method for Micro-Electro-Mechanical-System Photonic Switch" filed on Nov. 21, 2013, which application is hereby incorporated herein by reference.

An embodiment aligns mirrors without the extended locking of mirrors within a zone of uncertainty. Thus, all in-service mirrors remain under full dynamic control. In one example, one new connection at a time is set up in each zone of uncertainty. In another example, multiple mirrors per zone of uncertainty are set up at a time. In one example, all mirrors are set up simultaneously.

The control channel illumination is strobed at a moderately high frequency, creating control time slots. The control time slots are smaller than the time it takes MEMS mirrors to move a significant distance. For example, the motion for MEMS mirrors may be limited to ten times the 1-2 kHz mechanical resonance frequency, which may lead to a limit of 10-20 kHz. Strobing the control channel at frequencies substantially higher, for example at 50-100 kHz, enables the full spectrum range of motion derived mirror signal changes to be detected. By strobing the control illumination at more than two illuminations per cycle of the highest frequency the mirror position, above the Nyquist rate, the full frequency spectral information of mirror movement is retained. The strobing may be performed with multiple strobe phases such that for X % of the time the in-service channels are illuminated and for (100−X)% of the time the mirror control channels for the mirrors being set up are illuminated and the in-serviced control channel electronics are switched to be used for setup up beam detection. Because the switching occurs more rapidly than the motion in the mirrors, there may be a small reduction in the optical sensitivity of the control circuit. This small reduction may be compensated for by a slightly higher control optical power. Also, there is no effective loss in control bandwidth, which remains higher than the upper end of the frequency spectrum of mirror movement.

Creating a separation in time between the initial mirror set up and the in-service mirrors alignment maintenance prevents control crosstalk, since the control of the in-service mirrors is maintained during the setting up of nearby new mirror circuits, because the control of in-service mirrors and setting-up mirrors is now separated in time. Hence, in-service mirrors are not locked for the duration of the set-up of nearby mirrors. The time slots may be further sub-divided so that each mirror being set up is illuminated once every m set up optical illumination cycles, illuminated for 1/p of the duration of a set up optical illumination cycle, or both. This enables m mirrors, p mirrors, or m*p mirrors to be set up simultaneously per zone of uncertainty. Because the frame repetition rate of the strobe control is much shorter than the time taken to move a mirror, the mirror set up time is not significantly slowed when m times the frame length is much shorter than the mirror set up time. For a 100 kHz frame rate, m is less than about twenty to fifty.

The different target mirrors have zones of uncertainty with the same diameter as the other zones of uncertainty but centered on itself, creating a repeating pattern of usable set up channel numbers or phases across the surface of the MEMS array based on the number of mirrors within a zone of uncertainty. When m*p>n, where n is the number of mirrors per zone of uncertainty, all mirrors in the array may be simultaneously set up.

The splitting of the set up control channel illumination strobes into multiple phases can reduce the set up control bandwidth, because the effective sampling rate of the mirror position is reduced by a factor of m, because the Nyquist sampling rate is reduced. The residual set up channel bandwidth is still sufficient for a rapid setup. For example, a 100 kHz strobing rate is used where m=25 and p=1, the individual mirror illuminated during set up is illuminated four times per millisecond, providing a Nyquist sampling rate into the control system consistent with up to a 2 kHz envelope. Hence, measurements may be made in a fraction of a millisecond, less than the time to move the mirror. In another example, with m=5 and p=5, the control bandwidth remains over 10 kHz with a zone of uncertainty as large as 25 mirrors.

Separating in-service control from set up control may be achieved by creating a repetitive high frequency control frame. The data collected by the photodiodes and their receivers, both for the set up phase and the in-service phase is, in effect, an analog signal representing where the mirrors are positioned. This is determined by comparing the analog signals from the photodiodes. An analog signal may be sampled unambiguously and without the loss of bandwidth as long as the highest analog frequency present is less than half of the sampling frequency, under the Nyquist Theorem.

Figure 13:
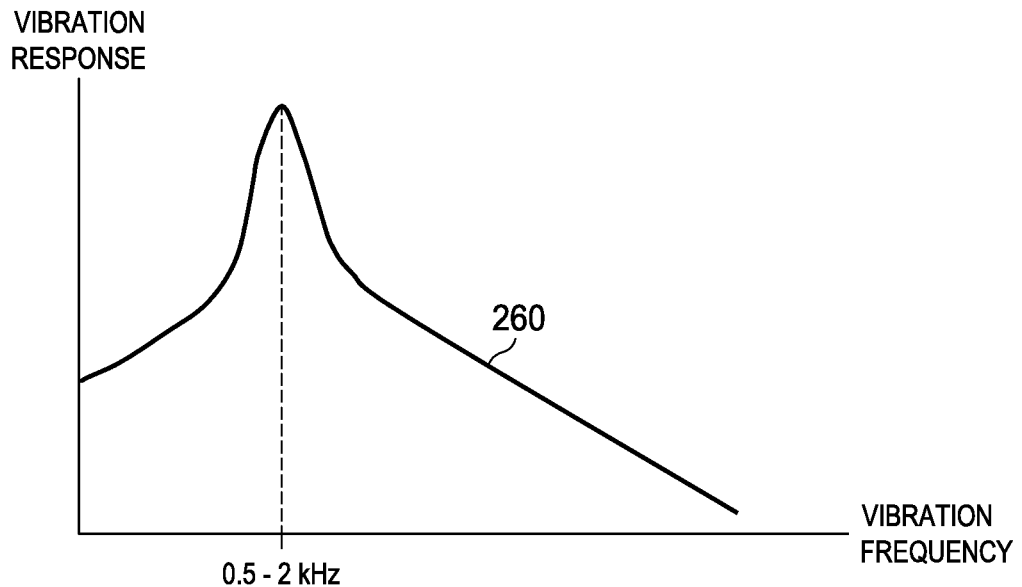
FIG. 13 illustrates a graph of a vibration response of a MEMS mirror.

The MEMS mirrors are small masses suspended by springs which exhibit mechanical resonances. For incoming external shock or vibration frequencies impacting the MEMS mirrors, the highest frequencies tend to be absorbed by the mirror-spring system, because there is not sufficient time for the spring force to perturb the mirror before the phase of the incoming vibration reverses force. FIG. 13 illustrate vibration response 260 of a mirror-spring system. At low frequencies, the vibration is passed through to the MEMS mirrors up to the point where forces in the torsion gimbal springs reach a mechanical resonance. Above the resonance, the response falls off. This roll-off may be increased by vibration isolating the MEMS module with mechanical mounts. The mirror-spring system has a resonant peak that may be fairly high Q. Vibration response 260 has one resonant peak and a tail with a slope of about 20 dB per decade. In other examples, there are two or more resonant peaks in the mirror-spring spacing. The gimbal springs may have similar torsional rigidity characteristics but are supporting different masses—in one axis the mass is the mirror, in the other axis it is the mirror, the other set of gimbal springs and the gimbal ring. The response may be bandwidth limited at about 20 kHz. Hence a sampling rate of at least 40 kHz may be used. Lower sampling rates may be used for a different response.

Switching the control channel optical power on and off at a 50-100 kHz rate with different phases generates alternating periods where the control channels of the mirrors that are in-service are illuminated in one period and the control channels of the mirrors that are being set up are being illuminated in the other period. The control channel control circuit of the in service mirrors are also switched between sampling the control beams for those mirrors during the period when the in-service control channels are illuminated and forming a detection grid for the arrival of an initial set up beam during the periods when the set up beams are illuminated. The duration of these periods may be around five to ten microseconds, which is much shorter than the time it takes for the MEMS mirrors to change position, but is a reasonably low frequency for optical detection and control electronics to handle.

Figure 14:
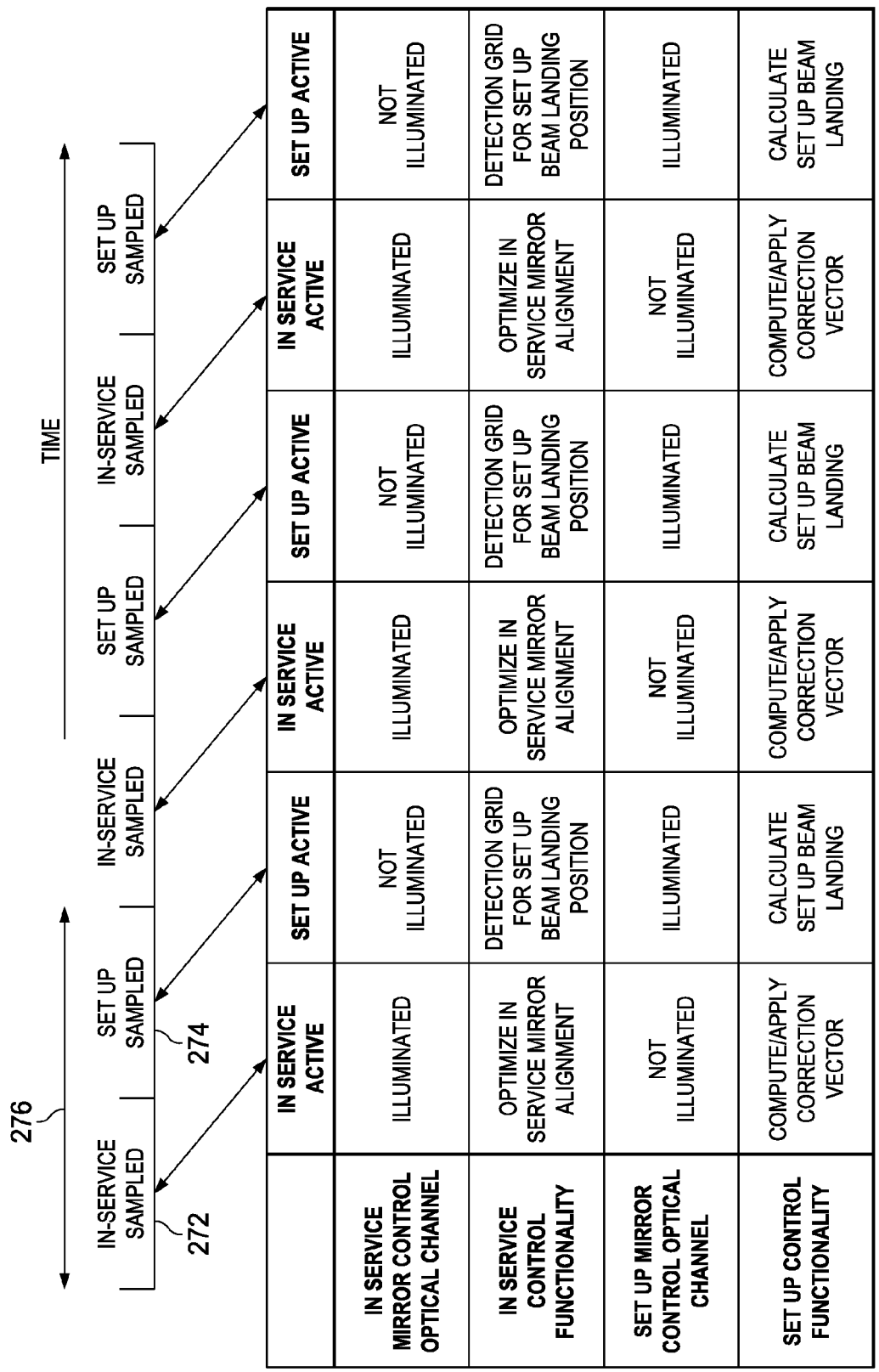
FIG. 14 illustrates an embodiment frame structure for aligning MEMS mirrors with integrated photodiodes.

In an example, a time period for setting up new connections is alternated with a time period for maintaining in-service connections. FIG. 14 illustrates in-service sampled time slot 272, followed by initial set up sampled timeslot 274. These two timeslots have a time 276, which may be 10-20 microseconds at a 50-100 kHz repetition rate. The in-service mirrors' control beams are illuminated in alternate 5-10 microsecond periods of the frame to the control beams of mirrors being set up. When the in-service control light is present and the in-service control circuits are optimizing their associated mirrors, there is no control light present from the control optical carriers of the mirrors being set up, so no interference occurs. The in-service control circuits are active to control the in-service mirrors for the period when the in-service control beam is illuminated, but the mirrors are then locked for the next 5-10 microseconds, and their photodiodes and receivers are repurposed to act as a grid of set up beam landing site detectors. In the phase where the in-service control beams are not illuminated, the control beams of mirrors being initially set up are illuminated, and the mirror being set up will project that beam somewhere within the zone of uncertainty. The grid of repurposed controllers of the other mirrors in the zone of uncertainty coordinate the beam landing location, which are fed to the controller of the mirrors being setup up. During the following portion of the cycle, when the in-service mirrors are being illuminated, the controller of the mirror being set up will calculate the correction vector and will apply that correction voltage to the mirror. The mirror takes a significant time to move. Then, the process is repeated, to determine whether the mirror is well enough aligned for local setup, when the initial setup process ends. Thus, the in-service mirrors and initial set up mirrors have continuous control.

Figure 15:
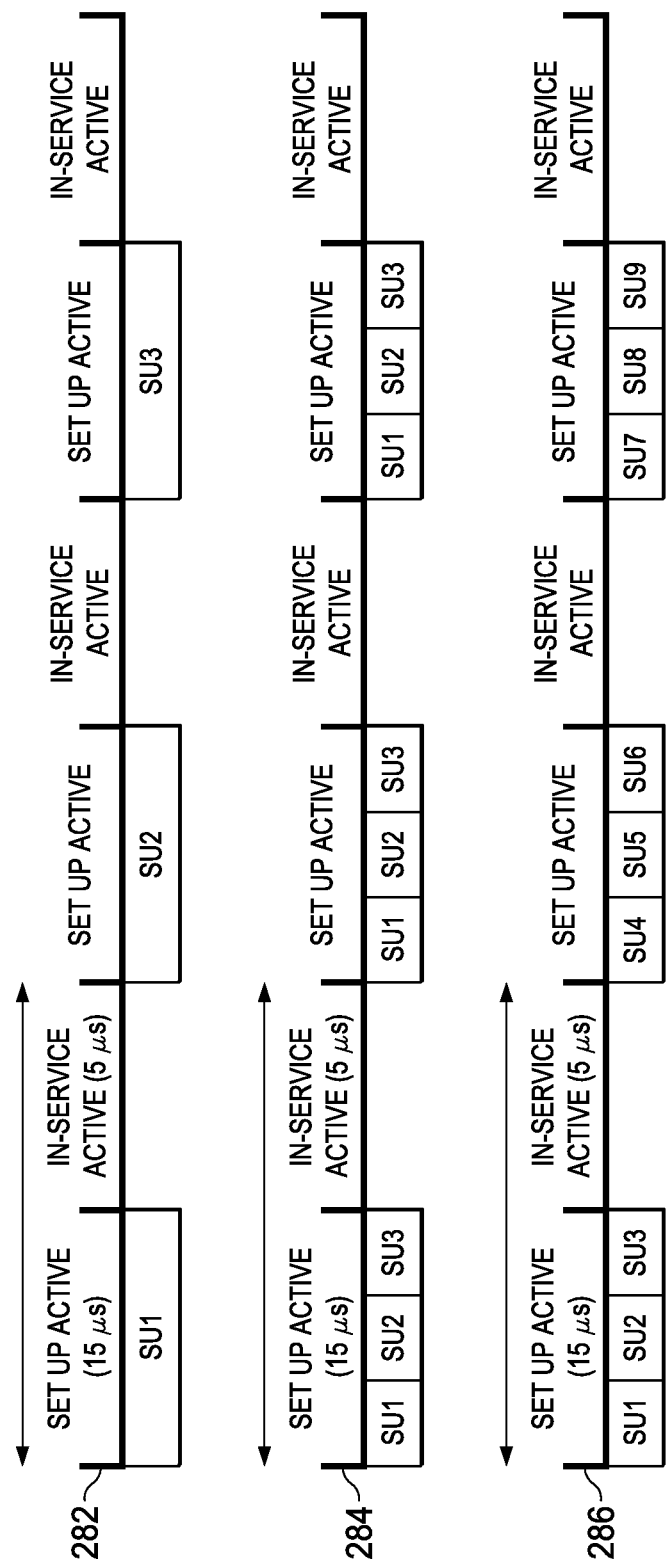
FIG. 15 illustrates additional embodiment frame structures for aligning MEMS mirrors with integrated photodiodes.

FIG. 15 illustrates various multi-frame timeslots. In pattern 282, a 15 µs time slot for initial set up alternates with a 5 µs timeslot for in-service maintenance. In this example, a maximum of three mirrors can be set up simultaneously in each zone of uncertainty. One mirror is set up in each set up timeslot. In pattern 284, each of the three mirrors being set up per zone of uncertainty has a 5 µs timeslot within the initial set up portion of the frame. In pattern 286 nine mirrors can be set up simultaneously in each zone of uncertainty. In each initial set up portion of the frame three mirrors have a timeslot, and the set up portions of the frame themselves have a three frame multi-frame. Thus, all nine mirrors are aligned in the initial set up timeslot. Frames may have higher numbers than these examples. For instance, a sub-division dividing active frames into 4-8 slots and 4-16 frames within the multi-frame structure facilitates up to 16-128 mirrors per zone of uncertainty to be set up simultaneously.

The control signals are modulated into being active during the appropriate timeslot. This may be achieved by using a single light source and an array of modulators or an array of optical sources. When an array of modulators is used, the splitting functions may be performed in a compact photonic integrated circuit (PIC), for example based on a silica waveguides. Splitters and couplers may be a hybridized electro-optic Mach Zehnder array, for example made of lithium niobate, silica, GaAs/AlGaAs, or InP/InGaAsP. Instead of a Mach-Zehnder interferometer, amplitude modulation, phase modulation, frequency modulation, or polarization modulation may be used. An electro-optic p-type intrinsic n-type (pin) modulator may be used. The modulator may be an interferometer type operating in carrier injection mode or carrier depletion mode, or an electro-absorption modulator operating in carrier injection mode.

Figure 16:
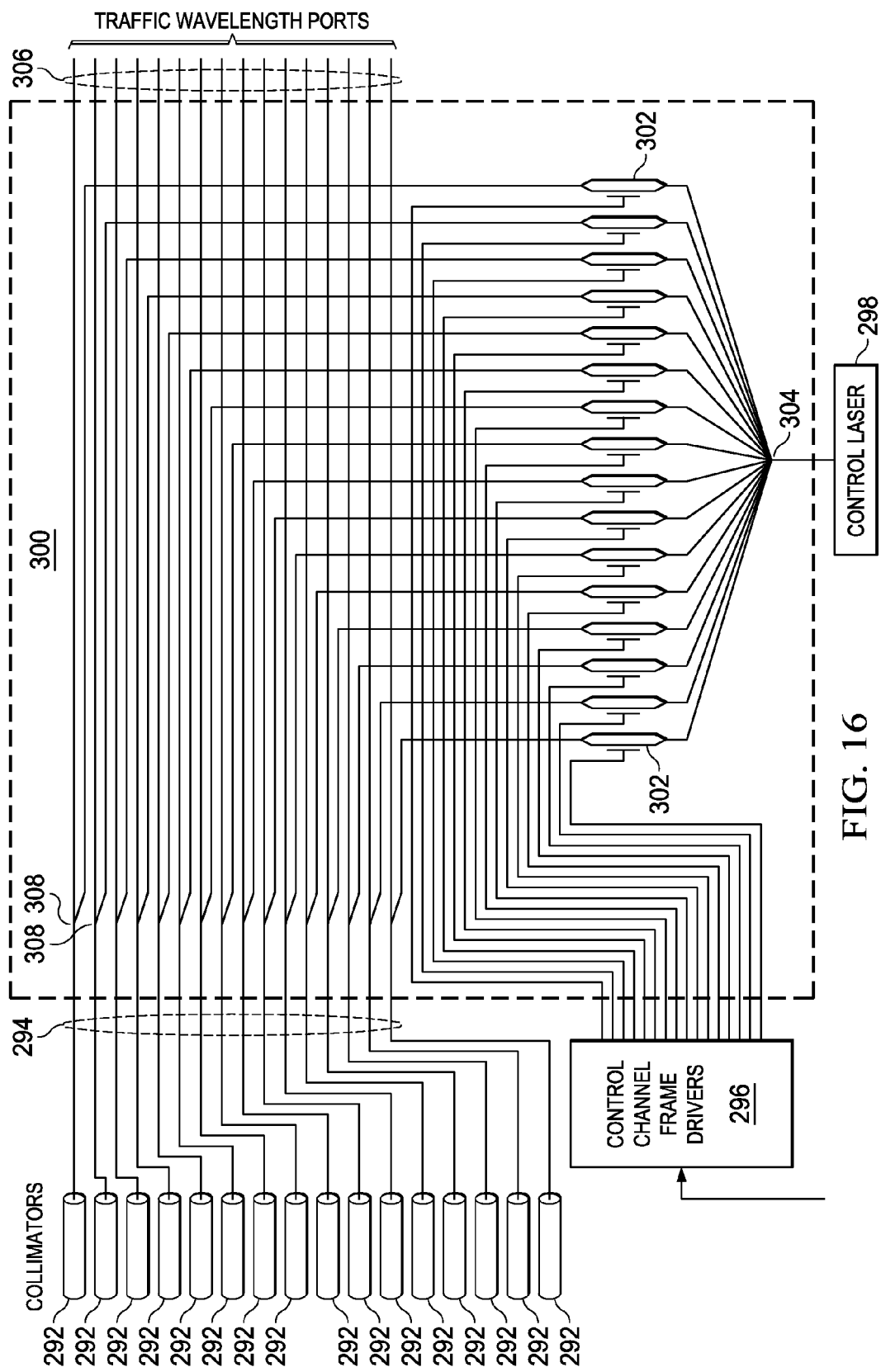
FIG. 16 illustrates an embodiment control light source.

FIG. 16 illustrates the functions for generating, timing, and injecting the optical control channel into sixteen collimators on a MEMS module. Control laser 298 may be a low cost low power coolerless laser at the control wavelength. The control wavelength may, for example, be 800-850 nm, 980 nm, or 1480 nm. The optical power is split in splitter 304, a 1:16 optical waveguide-based splitter into individual optical paths. These individual optical paths feed the Mach-Zehnder interferometers 302. In a Mach-Zehnder interferometer, when the optical path length of the two arms are equal, light passes through from complete constructive interference. However, when the optical path lengths of the arms are unequal, for example by applying an electric field to one arm, the output signal decreases due to destructive interference. When the phase shift between the two arms is 180°, there is complete destructive interference, and no output. The appropriate electric field level for complete destructive interference may be obtained by using the MEMS substrate photodiodes to detect the control signal power which is fed back to the control channel frame drivers 296 to set the correct drive voltage for the Mach Zehnder interferometers. This may be performed during equipment commissioning or during the set up time slot on a port not being set up.

In an example, Mach-Zehnder interferometers 302 are silicon acousto-optical modulators that change length based on the acousto-electrical (piezoelectric) effect, whereby the material dimensions change when an electric field or pressure is applied to change the dimensions. In this case an electric field is applied so as to produce a dimensional change. This is applied to vary the optical path length of one leg of a Mach-Zehnder interferometer. Alternatively, optical modulators are hybridized, based on a non-silicon dioxide material, or are piezoelectric optical modulators. The modulation may also carry a switch path identity once the connection is complete for connection verification purposes.

Mach-Zehnder interferometers 302 are driven by electrical signals from control channel frame drivers 296. Control channel frame drivers 296 select the set up phase or in service phase for the interferometers. Control channel frame drivers 296 create a 50-100 kHz frame from the master timing block. Based on input from the overall MEMS controller, control channel frame drivers 296 determines which ports are driven in the time slot.

Waveguides in PIC 300 are single mode at the control wavelength. PIC 300 may be in hybrid optical technologies, for example on a silica optical waveguide base. Fibers 294, which link PIC 300 to collimators 292, are single mode at both the control and traffic wavelength. Traffic enters through traffic wavelength ports 306. The traffic light and the control light are combined by combiners 308, which are single mode at both the control wavelength and the traffic wavelength. In another example, the collimators are directly mounted on the PIC without fibers 294. This may be achieved using V groove technology to avoid the use of fibers 294.

Figure 17:
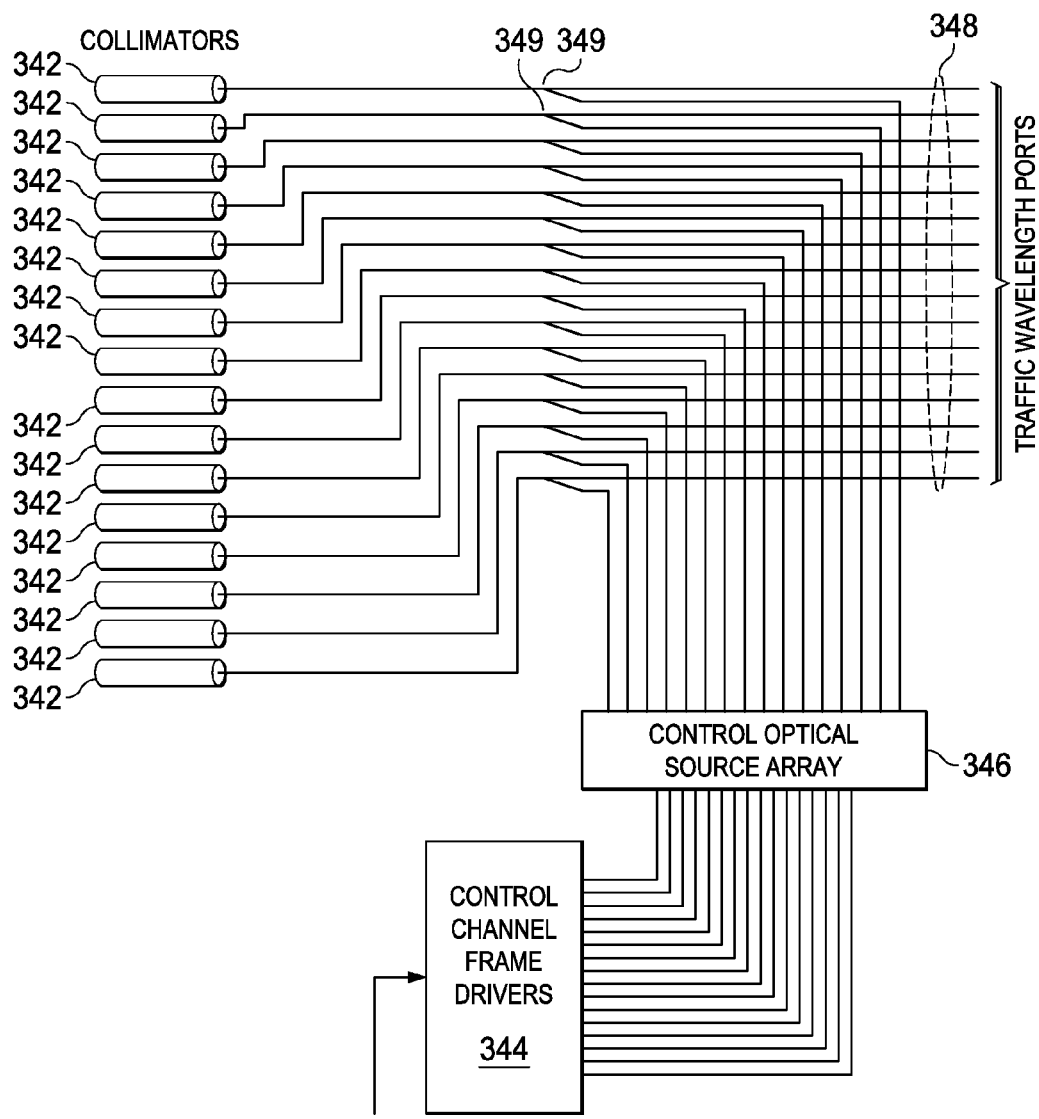
FIG. 17 illustrates another embodiment control light source.

In another embodiment, an array of lasers is used, with one laser per input to the MEMS module. In FIG. 17, control channel frame drivers 344 select sources from control optical source array 346. Control optical source array 346 may be an array of vertical cavity surface emitting lasers (VCSELs), another low cost laser array, or a light emitting diode (LED) array. The light sources may be controlled by modulating their drive currents. The control outputs from control optical source array 346 are combined by with the traffic light from traffic wavelength ports 348 by combiners 349. This combined output then goes to collimators 342.

Figure 18:
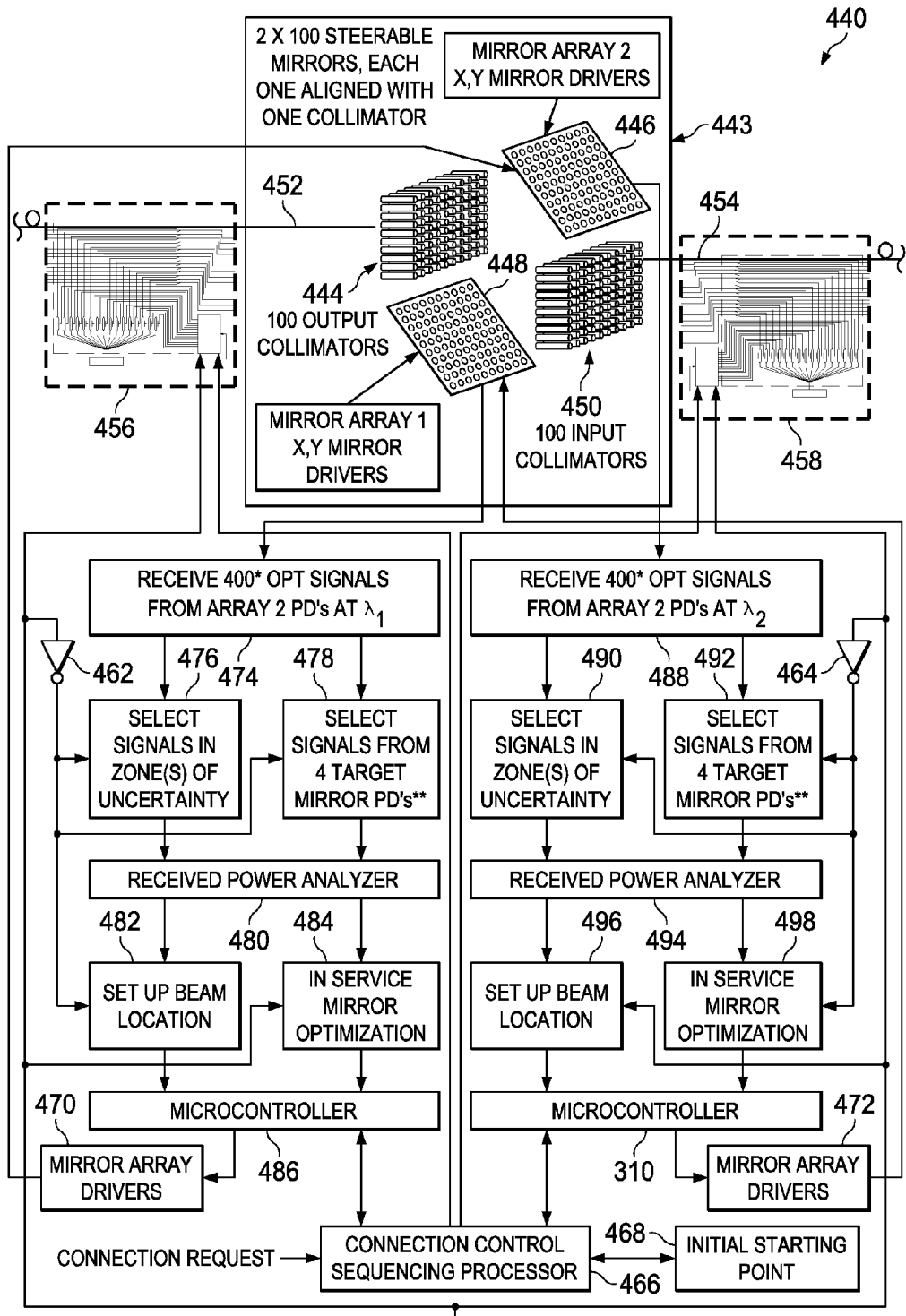
FIG. 18 illustrates an embodiment control structure for aligning MEMS mirrors with integrated photodiodes.

FIG. 18 illustrates control system 440 for a MEMS system with interstitial photodiodes on a MEMS mirror array and an expanded control beam. A similar control system may be used with MEMS mirror arrays with photodiodes on the surface of the MEMS mirrors MEMS mirror module 443 contains collimator array 444, mirror array 446, mirror array 448, and collimator array 450.

A connection request is received by connection control sequencing processor 466. Initial starting point block 468 provides the initial starting angle for the mirrors for connection. The initial angles may be based on a geometric representation of the MEMS array and the mirror chamber layout. For example, the mapping of input and output ports to a MEMS mirror row and column are used to determine the angles based on geometry. In another example, initial starting point block 468 may also contain a mapping of angular displacement versus the required x and y axis drive voltages, which may be derived from a table of generic average values or from a table specific to the associated array, based on the measurements of a few mirrors in the array. Alternatively, the mapping of angular displacement is a more complex function that translates the initial required mirror angles into the initial required drive voltages.

The drive voltage values are passed to microcontrollers 486 and 310, which are associated with mirror array 446 and mirror array 448, respectively. While microcontrollers 486 and 310 are pictured as one microcontroller per mirror array for clarity, they may handle groups of mirrors or mirror arrays and communicate between themselves to better utilize their capacity. Microcontrollers 486 and 310 feed the drive values to mirror array drivers 470 and 472, respectively, which drive mirror arrays 446 and 448.

Meanwhile, connection control sequencing processor 466 communicates the port numbers being set up to control channel optical carrier generators 456 and 458, which are instructed to block the optical control channels being set up. This is so the control channel carrier does not splash across other mirrors' photodiodes on its path to its initial set up position inside the zone of uncertainty. While the splashing would not disrupt paths that are already set up (since they are separated in time by the frame structure of the control illumination) it could disrupt the setting up in progress of other mirrors in remote zones of uncertainty that are being set up at the same time. The output light proceeds along fibers 452 and 454 respectively, to collimator arrays 444 and 450. After a period of time, for example about one millisecond, the initial pointing is established somewhere inside the zone of uncertainty, and control channel optical carrier generators 456 and 458 turn on the optical channel.

Control frame master timing block 460 coordinates the timing by providing a signal indicating whether the system is in an initial set up mode or a maintenance mode. Gates 462 and 464 negate the signal.

The optical responses of the photodiodes are received by receiver blocks 474 and 488.

When initial alignment is being performed, select signals in zones of uncertainty blocks 476 and 490 select the photodiodes in the zone of uncertainty for the mirror path being set up and pass these signals to received power analyzers 480 and 494, respectively. However, when in-service positional maintenance is being performed, select signals from target mirrors blocks 478 and 492 select the signals from the photodiodes associated with the mirrors the alignment of which is being maintained, and passes these values to received power analyzers 480 and 494.

When new beams are being set up, set up beam location blocks 482 and 496 are used. However, when in service mirrors are being maintained, in service mirror optimization blocks 484 and 498 are used.

Figure 19:
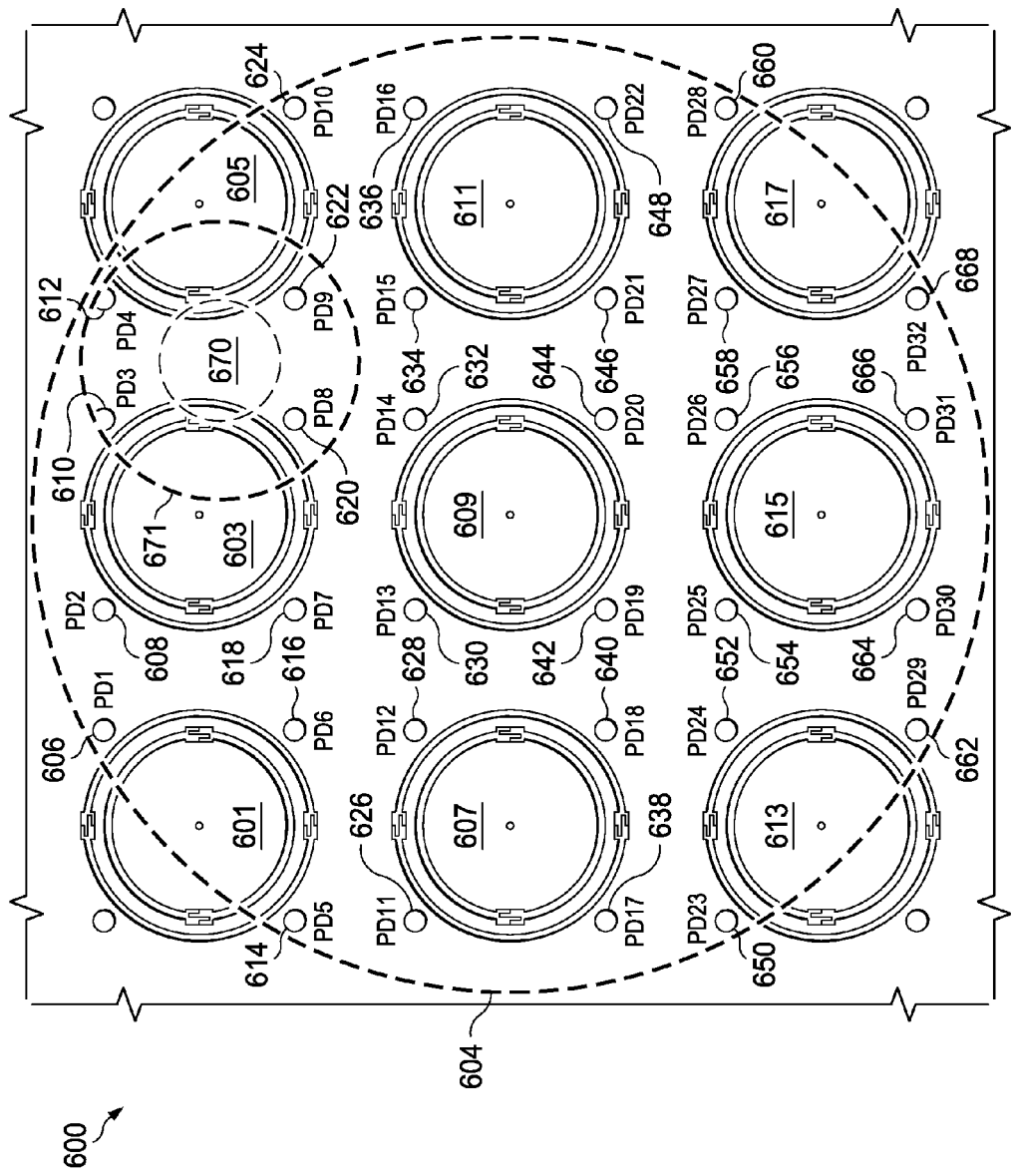
FIG. 19 illustrates a zone of uncertainty for a MEMS mirror array with interstitial photodiodes.

FIG. 19 illustrates MEMS array 600 containing an array of MEMS mirrors with interstitial photodiodes. Mirror 609 has zone of uncertainty 604 surrounding it. MEMS mirrors 601, 603, 605, 607, 611, 613, 615, and 617 fall partially or wholly within zone of uncertainty 604. Also, photodiodes 606, 608, 610, 612, 614, 616, 618, 620, 622, 624, 626, 628, 630, 632, 634, 636, 638, 640, 642, 644, 646, 648, 650, 652, 654, 656, 658, 669, 662, 664, 666, and 668 fall within zone of uncertainty 604. In this example, traffic beam 670 and control beam 671 land above and to the right of mirror 609 such that control beam 671 illuminates photodiodes 610, 612, 620, and 622 during the set up time slot or the appropriate component of the set up time slot of the control frame.

Received power analyzers 480 and 494 recognize the beam landing spot based on the signals from photodiodes 610, 612, 620, and 622. FIG. 20 illustrates response 680 of photodiodes within zone of uncertainty 604 during the set up time slot or the appropriate component of the set up time slot of the control frame. The values from these photodiodes may be processed by an algorithm that averages the photodiodes' positions on the grid or takes a weighted linear average of the responses to more accurately determine the location of the beam center. In this example, traffic the beam's center is closer to photodiode 610 than photodiode 612, and closer to photodiode 620 than to photodiode 610. Received power analyzers 480 and 494 pass the location of the beam landing spot to set up beam location blocks 482 and 496.

Set up beam location blocks 482 and 496 compute a correction vector from the current beam location to bring the center of the beam towards the center of the target mirror. In this example, the beam's center should be brought about half a mirror pitch to the left and almost an entire mirror pitch downwards.

Microcontrollers 486 and 310 consult initial starting point algorithm 468 to determine the correction voltage to apply to achieve the desired positional shift. Alternatively, microcontrollers 486 and 310 store this information locally in the form of a delta to the voltage drive to create a unit of beam movement on the opposing substrate. Microcontrollers 486 and 310 pass this drive voltage to mirror array drivers 470 and 472, which adjust the position of the mirror opposing the target mirror. After about a millisecond later, to give the mirror time to settle, the process is repeated, and an additional correction can be made if needed. When this process fails to trigger a significant response from photodiodes other than those surrounding the target mirror (photodiodes 630, 632, 642, and 644) the initial set up sequence is complete, and microcontrollers 486 and 310 advise connection control sequencing processor 466 that the set up process is complete.

Then, connection control sequencing processor 466 triggers control channel optical carrier generators 456 and 458 to switch the ports being set up to the optimization mode and control format. This causes only the optimization portion of the optical control channel frame to be illuminated. The received power falls on the four photodiodes surrounding the target mirror, photodiodes 630, 632, 642, and 644. When the beam is not fully centered on mirror 609, the illumination of photodiodes 630, 632, 642, and 644 is unequal. Received power analyzer 480 and 494 receive the photodiode signals and compute the beam center site. In service mirror optimization blocks 484 and 498 then determine the correction vector. In one example, this is achieved by nudging the beam in a series of small steps towards the photodiode with the least power. Alternatively, the correction vector is determined based on a weighted interpolation or a fitting of received power values to the cross sectional intensity of the beam.

Once the beam is centered on the target mirror, and an equal or nearly equal power is reported by the mirror's photodiodes, the overall set up and optimization stages are complete, and the new path enters service.

Control channel optical carrier generators 456 and 458 continue to apply the optimization mode optical control channel and the optimization process continuously or intermittently to maintain the mirrors in service.

As described, only one mirror at a time can be set up in a non-overlapping zone of uncertainty. Because an N×N mirror zone of uncertainty overlaps ($N^2-1$) other zones of uncertainty, the switch set up time is increased by a factor $N^2$. Hence, if an initial set up time is 5 ms of an overall 10 ms set up and optimization time for one mirror and the zone of uncertainty is nine mirrors, then the set up time for all connections on the switch is (5*9)+5=50 ms.

Figure 21:
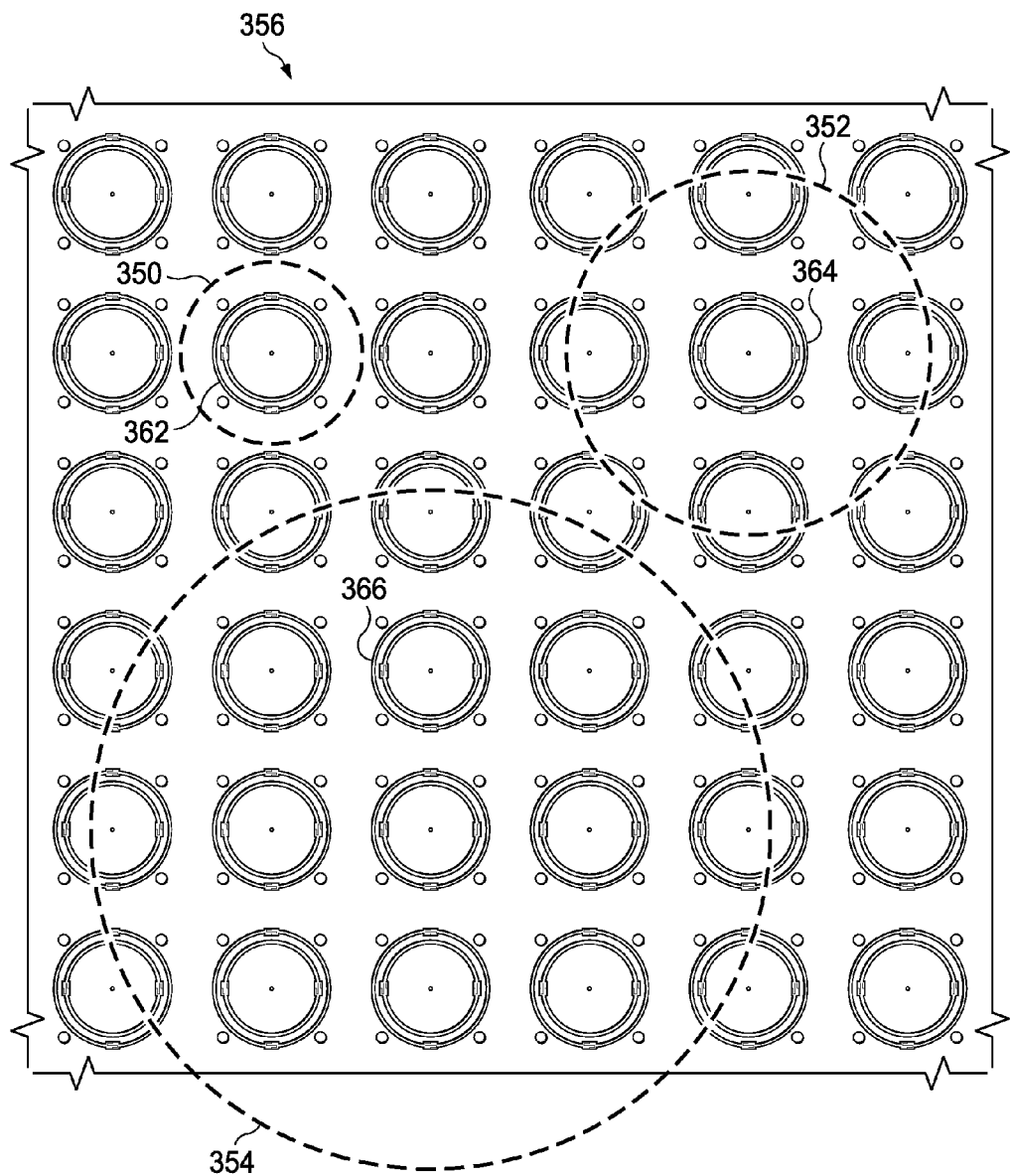
FIG. 21 illustrates zones of uncertainty for a MEMS mirror array with interstitial photodiodes.

FIG. 21 illustrates MEMS mirror array 356 with interstitial photodiodes, which demonstrates various zones of uncertainty. A zone of uncertainty arises because the initial pointing of the mirrors is blind, in that the mirror pair to be set up is determined by a calculated or looked up approximately correct drive voltage. Then, the actual deflection and resultant beam landing spot are determined from a correction vector to bring the mirrors into better alignment. One method of minimizing the size of the zone of uncertainty is to pre-measure, during manufacturing testing or equipment provisioning, every deflection voltage actually required to point every individual mirror in the MEMS module at every mirror on the opposing mirror array. This is time consuming, taking about 28 hours for a 1000×1000 fabric, and generates around four million values to store. Using mirror arrays with interstitial photodiodes, the array may be characterized more quickly, but has the same storage requirement. For example, a 1000×1000 fabric may be characterized in about 80 minutes. This process results in a small zone of uncertainty, for example zone of uncertainty 350 around mirror 362, which only contains photodiodes associated with mirror 362.

In another example, a simple pointing algorithm which does not involve device calibration is used. The algorithm is based on the geometry of the MEMS array, and does not take into account the mirror to mirror or batch to batch variations, so the zone of uncertainty may be large, such as zone of uncertainty 354 around mirror 366.

In an additional example, the algorithmic approach is combined with one or four mirror-mirror deflection measurements per mirror array. This does not take into consideration the tolerances between the individual mirrors on the array, but does take into account the batch-to-batch differences, leading to an intermediate zone of uncertainty, for example zone of uncertainty 352 around mirror 364.

The zone of uncertainty is a cone of possible pointing angle errors originating at the deflected mirror creating a circle or ellipse on the opposing array, where that cone transects the surface of the opposite array. The zone of uncertainty on the opposite array is approximately circular, or elliptical if the mirror tolerances are different in the x and y directions or the arrays are angled so the beams do not arrive approximately normal to the surface. The zone of uncertainty is centered around the target mirror on the opposite array.

The number of other mirrors potentially impacted is determined by the area of the zone of uncertainty, which is proportional to the square of the maximum angular error. Hence, as the angular error increases, the number of mirrors affected may become larger. Furthermore, the size of the zone of uncertainty increases with larger mirror arrays due to the increased path lengths between the two arrays. The zone of uncertainty grows approximately linearly with the array size. For example, if a 100×100 switch, containing two 100 (10×10) mirror arrays has a zone of uncertainty affecting four mirrors besides the target mirror, a 400×400 switch, containing two 400 (20×20) mirror arrays using the same pointing precision will have zones of uncertainty of 16-20 mirrors, and a 1024×1024 switch, containing two 1024 (32×32) mirror arrays has a zone of uncertainty of 40-50 mirrors.

Figure 22:
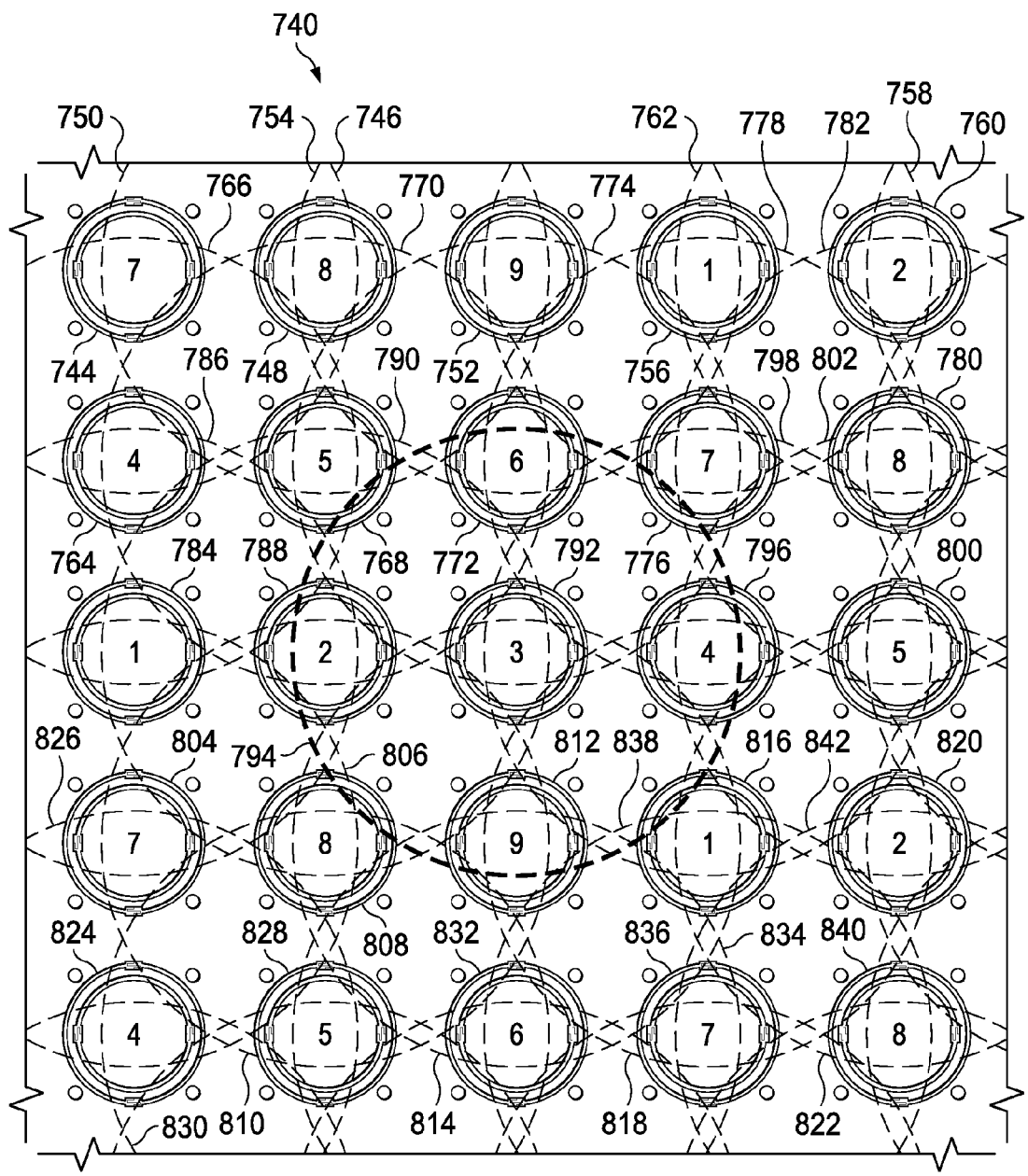
FIG. 22 illustrates an embodiment numbering scheme for MEMS mirror arrays.

The zone of uncertainty for each target mirror is centered on that target mirror. FIG. 22 illustrates mirror array 740 with interstitial photodiodes, where each mirror has a separate zone of uncertainty. The zones of uncertainty for the various mirrors are offset, each zone of uncertainty being centered around its target mirror, so the zones of uncertainty overlap. It is possible to assign a pattern of numbers to the mirrors such that a number only occurs once in any of the zones of uncertainty as is shown in FIG. 22. Table 1 below demonstrates, for the mirrors in mirror array 740, the mirror label, the label for the zone of uncertainty corresponding to that mirror, and the number assigned to that mirror for FIG. 22. The minimum number sequence length to achieve this is the square of the number of mirrors that are affected by the zone of uncertainty's diameter horizontally or vertically. For example, in FIG. 24, the zones of uncertainty have a diameter of three mirrors, so nine labels are used. The numbers are laid down on the mirror in a sequence propagating along a row, and propagating along the next row with an offset equal to the number of mirrors in the diameter of the zone of uncertainty. The number of mirrors may be 9 for a diameter of three mirrors, 25 for a diameter of five mirrors, 49 for a diameter of seven mirrors and 81 for 9 mirrors.

TABLE 1

| Mirror Label | Zone of Uncertainty Label | Assigned Mirror Number |
|---|---|---|
| 744 | 746 | 7 |
| 748 | 750 | 8 |

TABLE 1-continued

| Mirror Label | Zone of Uncertainty Label | Assigned Mirror Number |
|---|---|---|
| 752 | 754 | 9 |
| 756 | 758 | 1 |
| 760 | 762 | 2 |
| 764 | 766 | 4 |
| 768 | 770 | 5 |
| 772 | 774 | 6 |
| 776 | 778 | 7 |
| 780 | 782 | 8 |
| 784 | 786 | 1 |
| 788 | 790 | 2 |
| 792 | 794 | 3 |
| 796 | 798 | 4 |
| 800 | 802 | 5 |
| 804 | 806 | 7 |
| 808 | 810 | 8 |
| 812 | 814 | 9 |
| 816 | 818 | 1 |
| 820 | 822 | 2 |
| 824 | 826 | 3 |
| 828 | 830 | 4 |
| 832 | 834 | 6 |
| 836 | 838 | 7 |
| 840 | 842 | 8 |

Because the repetitive numbering pattern can uniquely identify any mirror in any zone of uncertainty, it may be used to create the set up process control illumination phases. For example, the pattern illustrated in FIG. 22 may be used for nine illumination phases of the set up control path. This number is based on the number of mirrors within a zone of uncertainty. The numbered mirrors in a zone of uncertainty are driven with different phases of set up control illumination, and can be set up in parallel.

Figure 23:
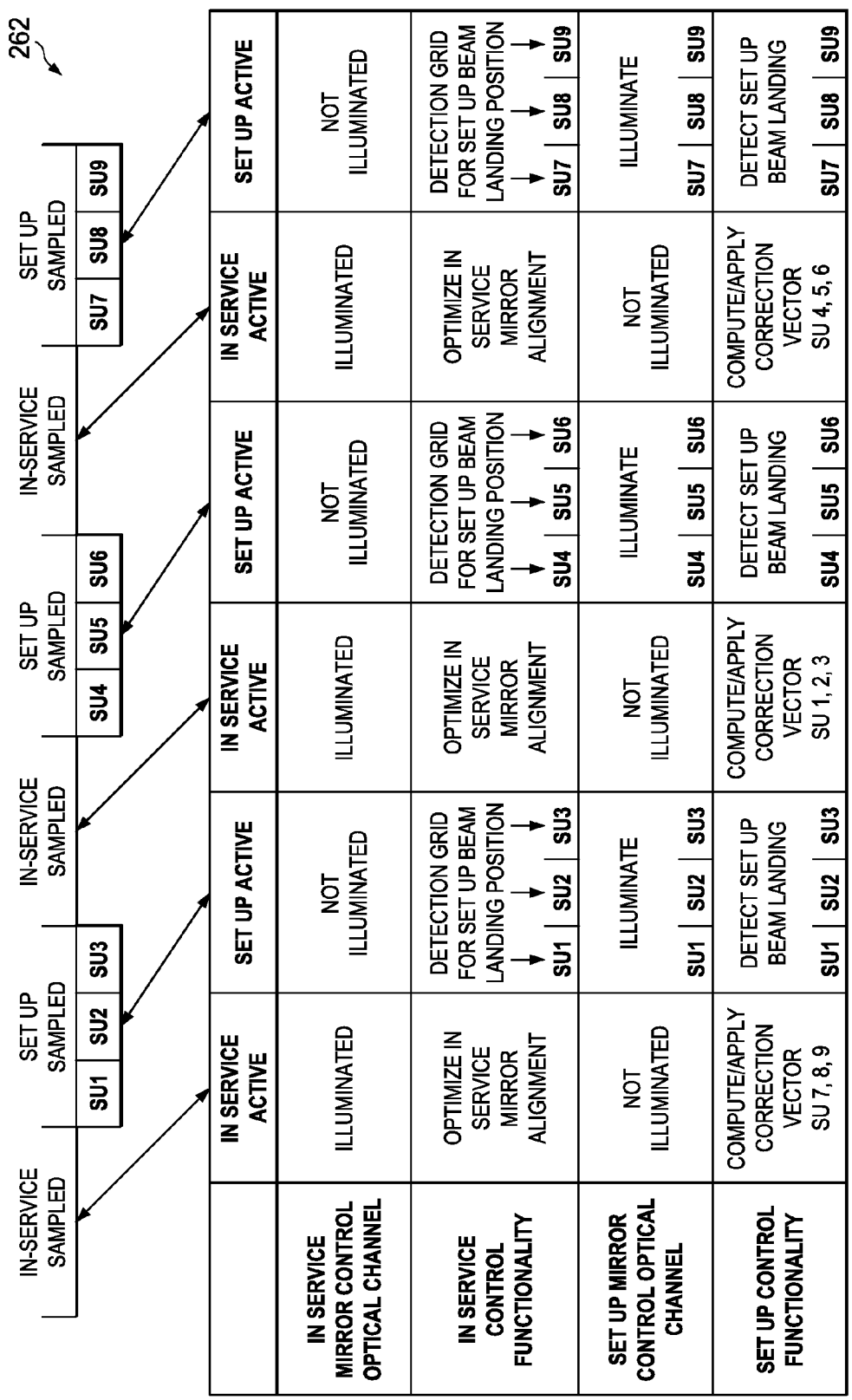
FIG. 23 illustrates an embodiment frame structure for aligning MEMS mirrors with integrated photodiodes.

FIG. 23 illustrates frame structure 262 for multiple set up frames. The select signals in the zones of uncertainty and set up beam location blocks make M measurements or calculation per control frame and select their zones of uncertainty based on the value from the control frame. Hence, the select signals in zone of uncertainty block selects the zones of uncertainty around each of its mirrors 1, 2, and 3 in the first control frame, 4, 5, and 6 in the second control frame, 7, 8, and 9 in the third control frame, and back to 1, 2, and 3 in the fourth control frame.

Figure 24:
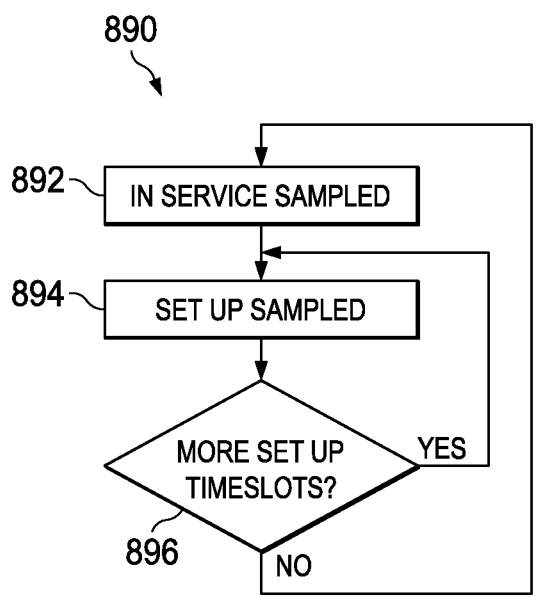
FIG. 24 illustrates a flowchart for an embodiment method of aligning MEMS mirrors with integrated photodiodes.

FIG. 24 illustrates flowchart 890 for a method of aligning MEMS mirrors. Both pairs of mirror arrays may be aligned at the same time. Initially, in step 892, in service mirrors are set up. The control channels for the in service mirrors are illuminated, and the photodiodes associated with the in service mirrors are sampled. All in service mirrors may be illuminated at the same time, because the control beam should only illuminate the photodiodes associated with the target mirrors. The signals from photodiodes associated with each in service mirror are compared, and the location of the control beam is determined. If the control beam is not centered on the mirror-associated photodiodes, then a vector is calculated to better center the control beams on the target mirrors. Then, the correction vector is applied to adjust the opposing mirrors. If the control beam has remained centered on the photodiodes of the appropriate in-service mirror, then no action is taken.

Next, in step 894, the set-up mirrors are aligned. All mirrors on a mirror array having the same label may be aligned at the same time, so they do not have overlapping zones of uncertainty. A control beam is launched. Responses of photodiodes from within the zone of uncertainty are compared to determine the control beam landing spot. The center of the control beam landing spot is determined from the response. A vector is determined to better center the control beam over the target mirror. The opposing mirror is adjusted to move the control beam by this correction vector.

Next, in step 896, it is determined whether there are more set up timeslots. When there are more set up timeslots, the next group of mirrors is set up in step 894. When there are no more set up time slots, the positional maintenance check and optional correction on the in service mirrors is performed in step 892.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A control system comprising:
a processor; and
a non-transitory computer readable storage medium storing programming for execution by the processor, the programming including instructions to:
produce a sequence of optical control beams in accordance with a framing structure, wherein the sequence of optical control beams is coupled to an array of collimators of a micro-electro-mechanical system (MEMS) photonic switch to reflect off mirrors of a first mirror array of the MEMS photonic switch to produce beam spots on a second mirror array of the MEMS photonic switch,
receive, by the processor, a plurality of signals in accordance with the optical control beams, from a plurality of photodiodes on the second mirror array; and
control, by the processor, mirrors of the first mirror array in accordance with the plurality of signals.

2. The control system of claim 1, wherein the framing structure is a repeating pattern of a set-up timeslot followed by a maintenance timeslot.

3. The control system of claim 2, wherein the instructions to control the mirrors of the first mirror array comprise instructions to control initial alignment of a set of unaligned mirrors of the first mirror array in accordance with the plurality of signals during the set-up timeslot.

4. The control system of claim 3, the programming including instructions to control maintenance alignment of a set of in-service mirrors of the first mirror array in accordance with the plurality of signals during the maintenance timeslot, the set of in-service mirrors and the set of unaligned mirrors being mutually exclusive.

5. The control system of claim 2 wherein an alternation rate between the set-up timeslot and the maintenance timeslot is greater than a mechanical resonance of the mirrors of the first mirror array.

6. The control system of claim 5, wherein the alternation rate between the set-up timeslot and the maintenance timeslot is greater than ten times the mechanical resonance of the mirrors.

7. The control system of claim 5, wherein the alternation rate between the set-up timeslot and the maintenance timeslot is greater than 20 kHz.

8. The control system of claim 2, wherein the set-up timeslot comprises a plurality of sub-timeslots.

9. The control system of claim 8, wherein the second mirror array has a zone of uncertainty, wherein a group of mirrors is within the zone of uncertainty, and wherein a number of sub-timeslots is greater than or equal to a number of mirrors in the group of mirrors.

10. A method comprising:
producing a sequence of optical control beams in accordance with a framing structure, wherein the sequence of optical control beams is coupled to an array of collimators of a micro-electro-mechanical system (MEMS) photonic switch to reflect off mirrors of a first mirror array of the MEMS photonic switch to produce beam spots on a second mirror array of the MEMS photonic switch,
receiving, by a controller, a plurality of signals in accordance with the optical control beams, from a plurality of photodiodes on the second mirror array; and
controlling, by the controller, mirrors of the first mirror array in accordance with the plurality of signals.

11. The method of claim 10, wherein the framing structure is a repeating pattern of a set-up timeslot followed by a maintenance timeslot.

12. The method of claim 11, wherein an alternation rate between the set-up timeslot and the maintenance timeslot is greater than a mechanical resonance of the mirrors of the first mirror array.

13. The method of claim 12, wherein the alternation rate between the set-up timeslot and the maintenance timeslot is greater than ten times the mechanical resonance of the mirrors.

14. The method of claim 12, wherein the alternation rate between the set-up timeslot and the maintenance timeslot is greater than 20 kHz.

15. The method of claim 11, wherein the set-up timeslot comprises a plurality of sub-timeslots.

16. The method of claim 15, wherein the second mirror array has a zone of uncertainty, wherein a group of mirrors is within the zone of uncertainty, and wherein a number of sub-timeslots is greater than or equal to a number of mirrors in the group of mirrors.

17. The method of claim 11, wherein controlling the mirrors of the first mirror array comprises controlling initial alignment of a set of unaligned mirrors of the first mirror array in accordance with the plurality of signals during the set-up timeslot.

18. The method of claim 17, further comprising controlling maintenance alignment of a set of in-service mirrors of the first mirror array in accordance with the plurality of signals during the maintenance timeslot, the set of in-service mirrors and the set of unaligned mirrors being mutually exclusive.

* * * * *